United States Patent
Kobayashi et al.

(10) Patent No.: US 12,027,614 B2
(45) Date of Patent: Jul. 2, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hitoshi Kobayashi, Yamato Kanagawa (JP); Yasuhiro Isobe, Tokyo (JP); Hung Hung, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 332 days.

(21) Appl. No.: 17/471,076

(22) Filed: Sep. 9, 2021

(65) Prior Publication Data

US 2022/0302294 A1    Sep. 22, 2022

(30) Foreign Application Priority Data

Mar. 19, 2021  (JP) ................................ 2021-046675

(51) Int. Cl.
*H01L 29/778* (2006.01)
*H01L 21/76* (2006.01)
(Continued)

(52) U.S. Cl.
CPC ...... *H01L 29/7786* (2013.01); *H01L 21/7605* (2013.01); *H01L 21/765* (2013.01);
(Continued)

(58) Field of Classification Search
CPC ......... H01L 21/28264; H01L 21/28575; H01L 21/7605; H01L 21/765; H01L 29/2003;
(Continued)

(56) References Cited

U.S. PATENT DOCUMENTS

| 9,722,063 B1* | 8/2017 | Kudymov ......... H01L 21/32136 |
| 2007/0249119 A1 | 10/2007 | Saito |
| 2010/0052014 A1 | 3/2010 | Matsushita |
| 2014/0001640 A1* | 1/2014 | Nishizawa ............ H01L 29/417 |
| | | 257/773 |

(Continued)

FOREIGN PATENT DOCUMENTS

| JP | H05-235045 A | 9/1993 |
| JP | 2007-294528 A | 11/2007 |

(Continued)

OTHER PUBLICATIONS

Notice of Reasons for Refusal mailed May 7, 2024 in corresponding Japanese Patent Application No. 2021-046675, 9 pages (with Translation).

*Primary Examiner* — Brook Kebede
(74) *Attorney, Agent, or Firm* — Kim & Stewart LLP

(57) ABSTRACT

A semiconductor device of an embodiment includes: a semiconductor layer including an element region and an element isolation region; a first insulation film provided on the semiconductor layer; a first electrode provided on the first insulation film and extending in a first direction; a second electrode provided on the semiconductor layer, arranged in a second direction intersecting with the first direction, and extending in the first direction; a third electrode provided on the semiconductor layer, arranged in the second direction, and extending in the first direction; second insulation films provided between the first insulation film and the semiconductor layer, and interposing the third electrode in the second direction; a first field plate electrode provided on the first electrode and connected to the first electrode; a second field plate electrode provided on the first field plate electrode and connected to the second electrode; and a third field plate electrode provided on the third electrode and connected to the third electrode. The second insulation films extend from the element isolation region to a part of the element region.

13 Claims, 24 Drawing Sheets

(51) Int. Cl.
*H01L 21/765* (2006.01)
*H01L 29/20* (2006.01)
*H01L 29/205* (2006.01)
*H01L 29/40* (2006.01)
*H01L 29/66* (2006.01)

(52) U.S. Cl.
CPC ........ *H01L 29/2003* (2013.01); *H01L 29/205* (2013.01); *H01L 29/404* (2013.01); *H01L 29/66462* (2013.01)

(58) Field of Classification Search
CPC . H01L 29/205; H01L 29/404; H01L 29/4966; H01L 29/518; H01L 29/66462; H01L 29/7786
See application file for complete search history.

(56) References Cited

U.S. PATENT DOCUMENTS

| | | | |
|---|---|---|---|
| 2015/0171204 A1 | 6/2015 | Nakayama et al. | |
| 2016/0079407 A1* | 3/2016 | Aoyama | H01L 29/66462 |
| | | | 257/194 |
| 2022/0199821 A1 | 6/2022 | Nanjo et al. | |

FOREIGN PATENT DOCUMENTS

| | | |
|---|---|---|
| JP | 2010-062321 A | 3/2010 |
| JP | 2011-077123 A | 4/2011 |
| JP | 2014-045174 A | 3/2014 |
| JP | 2015-115582 A | 6/2015 |
| JP | 2015-220430 A | 12/2015 |
| WO | 2021/024502 A1 | 2/2021 |

\* cited by examiner

SEMICONDUCTOR DEVICE

CROSS-REFERENCE TO RELATED APPLICATION

This application is based upon and claims the benefit of priority from Japanese Patent Application No. 2021-046675, filed on Mar. 19, 2021, the entire contents of which are incorporated herein by reference.

FIELD

Embodiments described herein relate generally to a semiconductor device.

BACKGROUND

Semiconductor devices such as a transistor and a diode are used for circuits such as a switching power supply circuit and an inverter circuit. These semiconductor devices are required to have a high withstand voltage and a low on-resistance. In order to prevent electric field concentration, a field plate electrode may be used for a semiconductor device.

DETAILED DESCRIPTION

Figure 1:
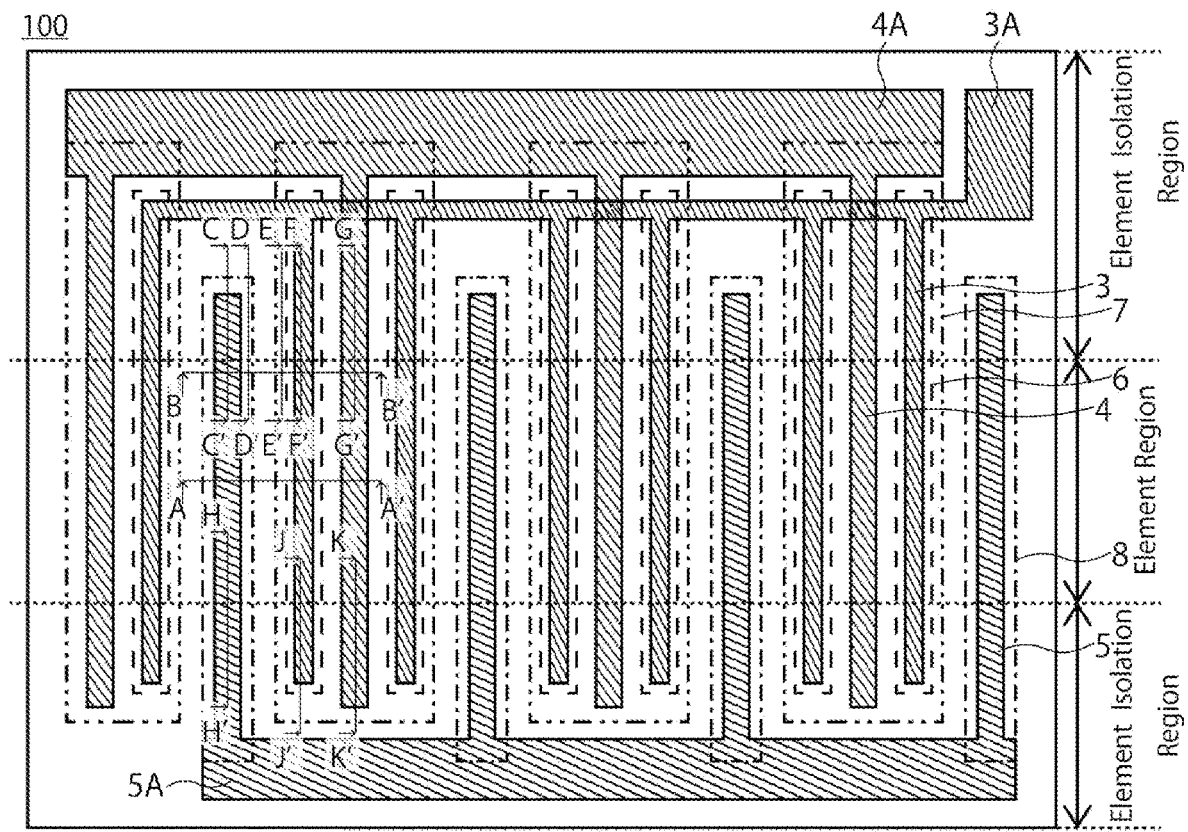
FIG. 1 is a schematic view of a semiconductor device according to an embodiment.

A semiconductor device of an embodiment includes: a semiconductor layer including an element region and an element isolation region; a first insulation film provided on the semiconductor layer; a first electrode provided on the first insulation film and extending in a first direction; a second electrode provided on the semiconductor layer, arranged in a second direction intersecting with the first direction, and extending in the first direction; a third electrode provided on the semiconductor layer, arranged in the second direction, and extending in the first direction; second insulation films provided between the first insulation film and the semiconductor layer, and interposing the third electrode in the second direction; a first field plate electrode provided on the first electrode and connected to the first electrode; a second field plate electrode provided on the first field plate electrode and connected to the second electrode; and a third field plate electrode provided on the third electrode and connected to the third electrode. The second insulation films extend from the element isolation region to a part of the element region.

Hereinafter, embodiments will be described with reference to the drawings. In the following description, the same or similar members are denoted by the same reference numerals, and the description of the members described once may be omitted.

In the present specification, a "nitride semiconductor layer" includes a "GaN-based semiconductor". The "GaN-based semiconductor" is a generic term for a semiconductor including gallium nitride (GaN), aluminum nitride (AlN), indium nitride (InN), and an intermediate composition thereof.

In the present specification, "undoped" means that an impurity concentration is $2\times10^{16}$ cm$^{-3}$ or less.

In the present specification, in order to indicate a positional relationship of components, and the like, an upward direction in the drawings is described as "upper", and a downward direction in the drawings is described as "lower". In the present specification, the concepts of the "upper" and the "lower" are not necessarily terms indicating a relationship with a direction of gravity.

Physical properties in the specification are values in an air atmosphere at 25° C.

First Embodiment

A semiconductor device according to a first embodiment includes a semiconductor element having a semiconductor layer, and a wiring layer on the semiconductor element.

Hereinafter, an example of a GaN-based semiconductor device will be described, but the semiconductor element may be a lateral transistor other than the GaN-based transistor.

Figure 2:
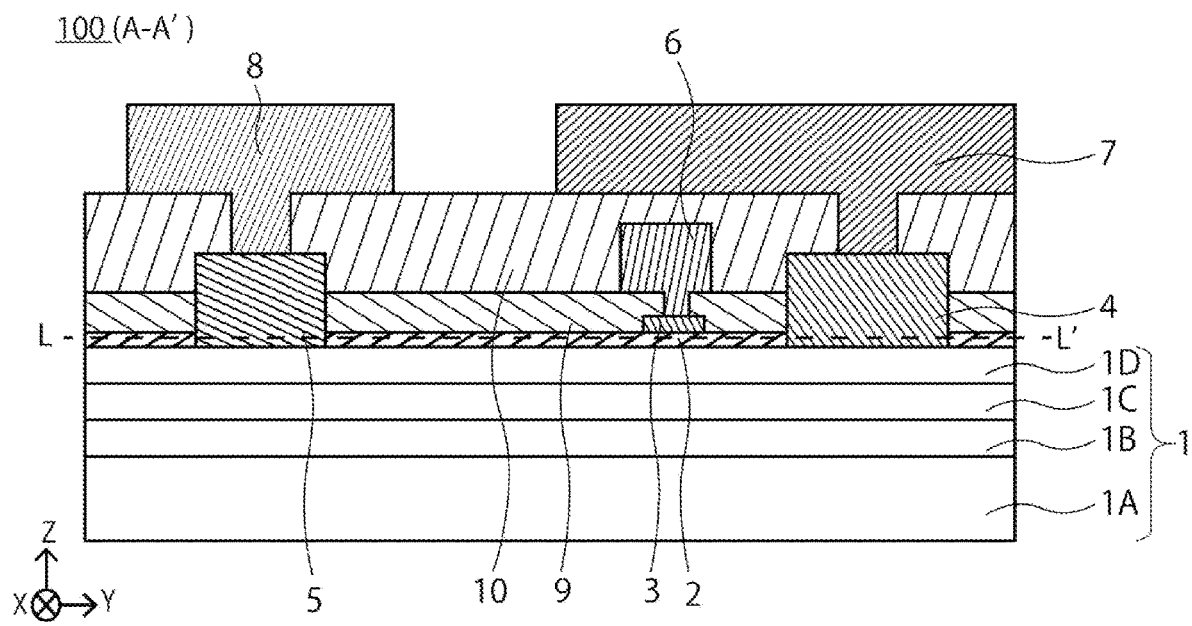
FIG. 2 is a schematic cross-sectional view of a semiconductor device according to an embodiment.
Figure 3:
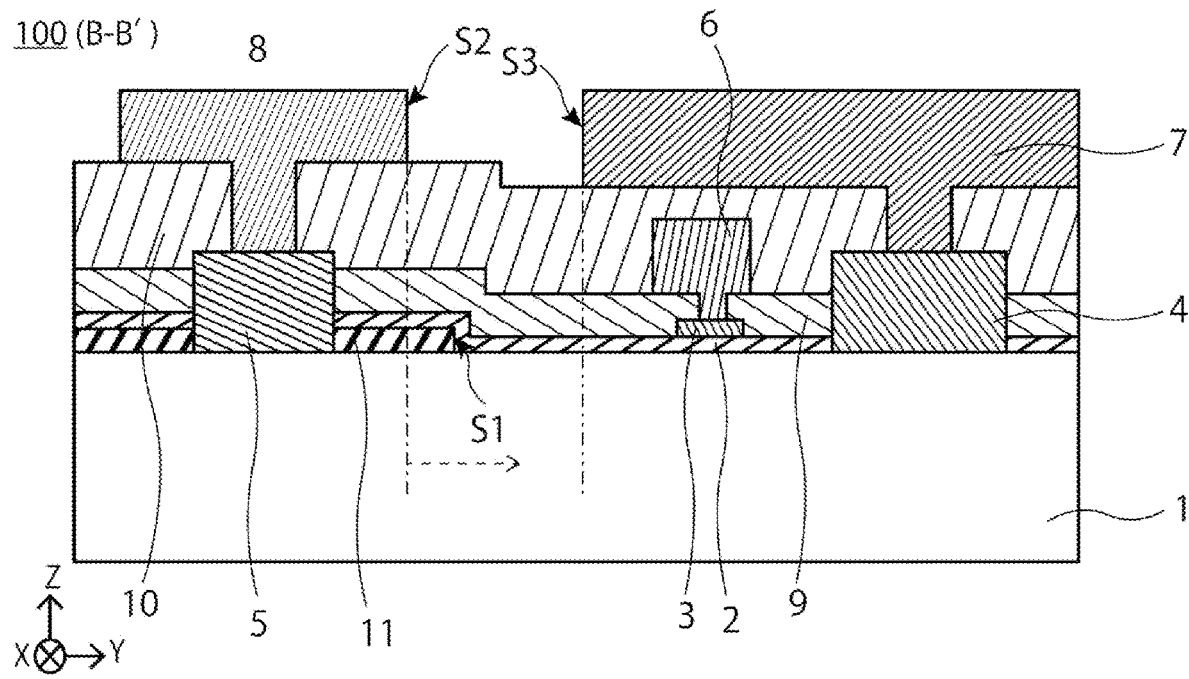
FIG. 3 is a schematic cross-sectional view of a semiconductor device according to an embodiment.
Figure 4:
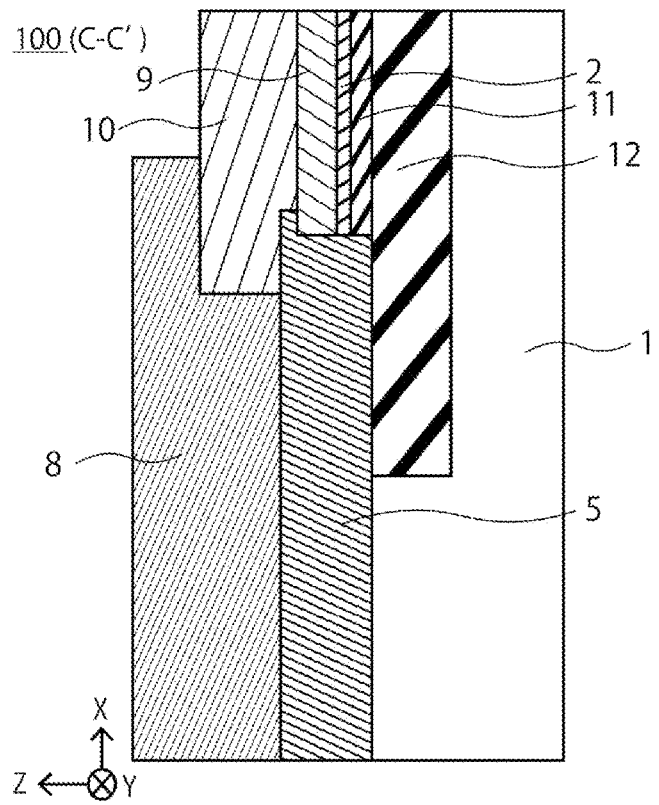
FIG. 4 is a schematic cross-sectional view of a semiconductor device according to an embodiment.
Figure 5:
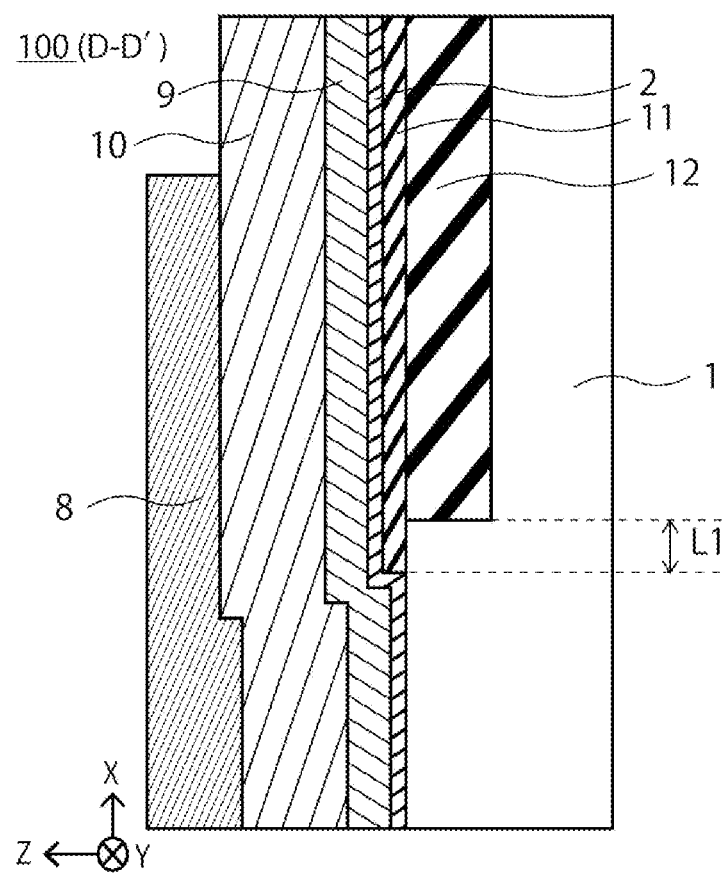
FIG. 5 is a schematic cross-sectional view of a semiconductor device according to an embodiment.
Figure 6:
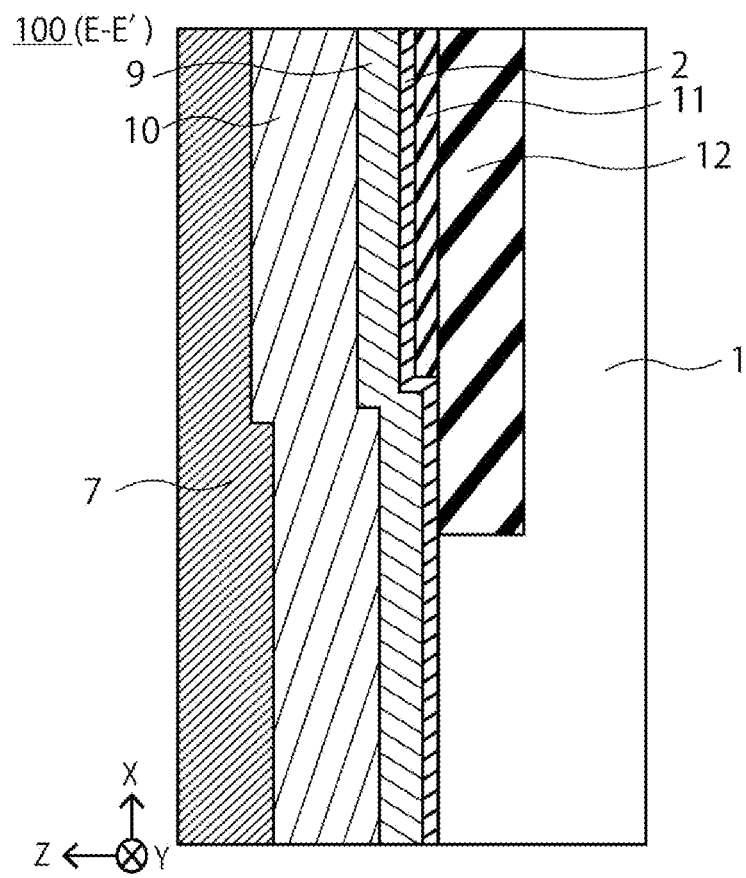
FIG. 6 is a schematic cross-sectional view of a semiconductor device according to an embodiment.
Figure 7:
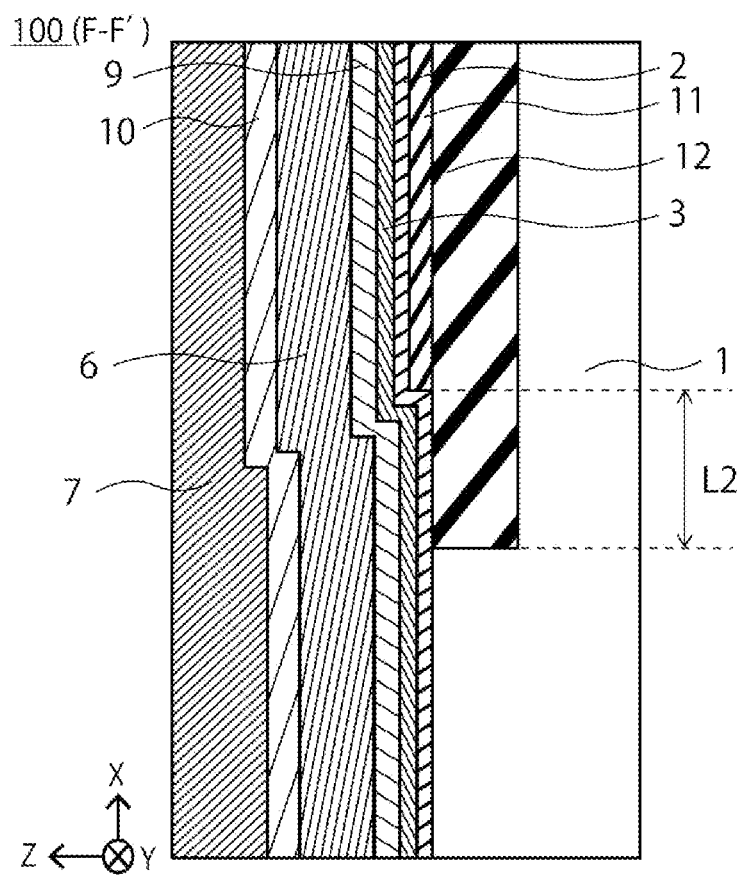
FIG. 7 is a schematic cross-sectional view of a semiconductor device according to an embodiment.
Figure 8:
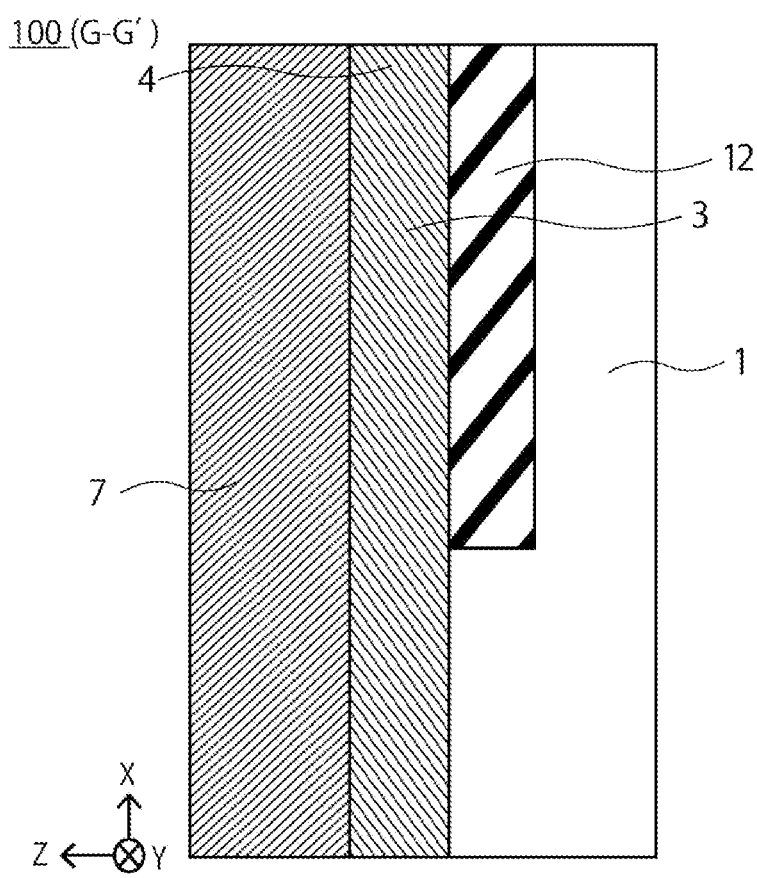
FIG. 8 is a schematic cross-sectional view of a semiconductor device according to an embodiment.
Figure 9:
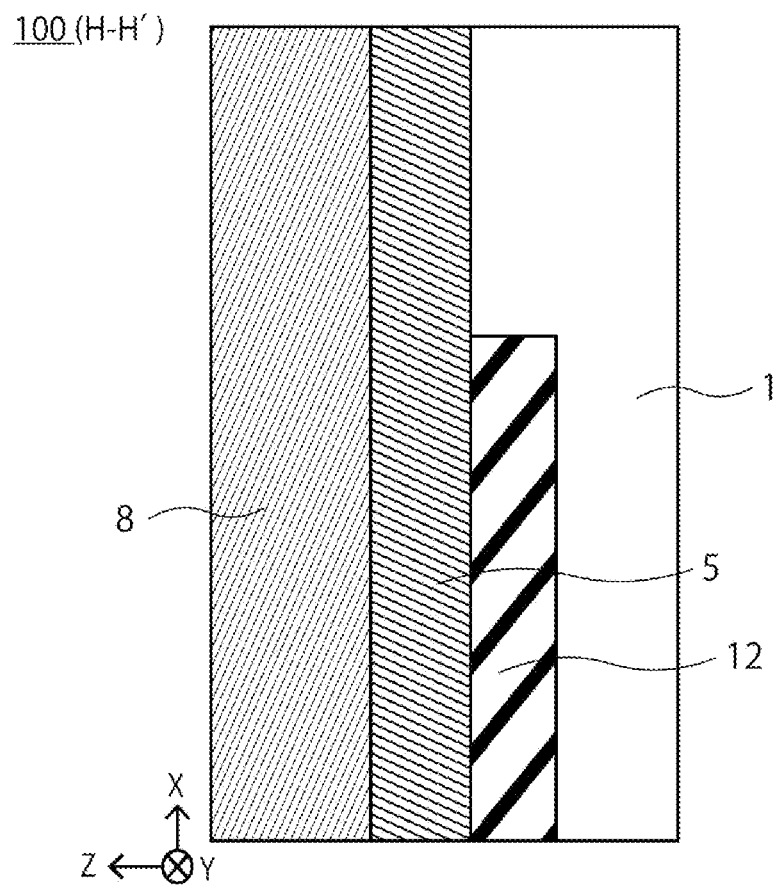
FIG. 9 is a schematic cross-sectional view of a semiconductor device according to an embodiment.
Figure 10:
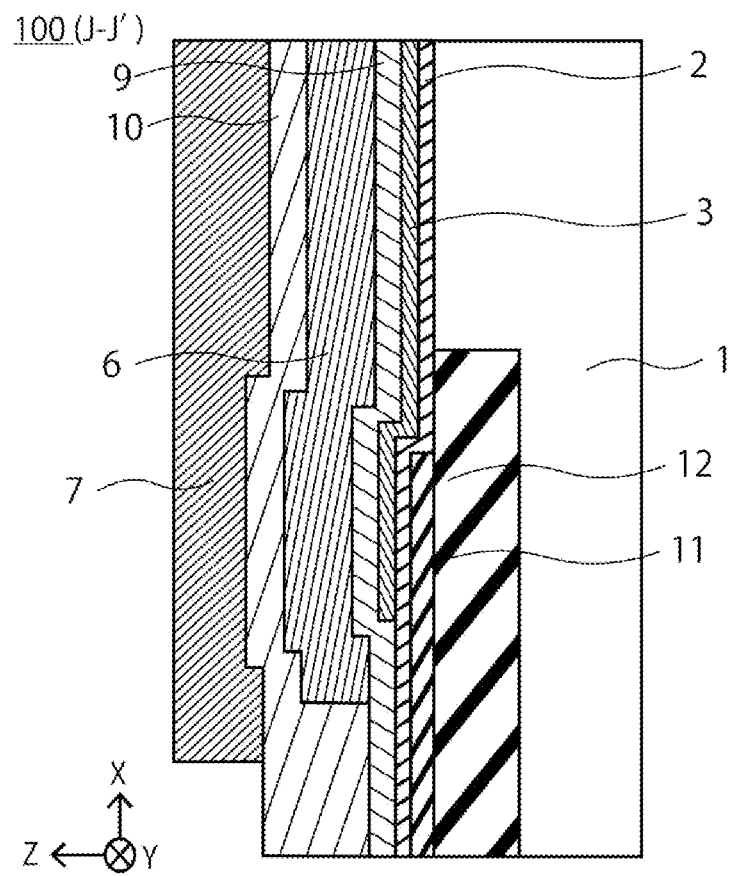
FIG. 10 is a schematic cross-sectional view of a semiconductor device according to an embodiment.
Figure 11:
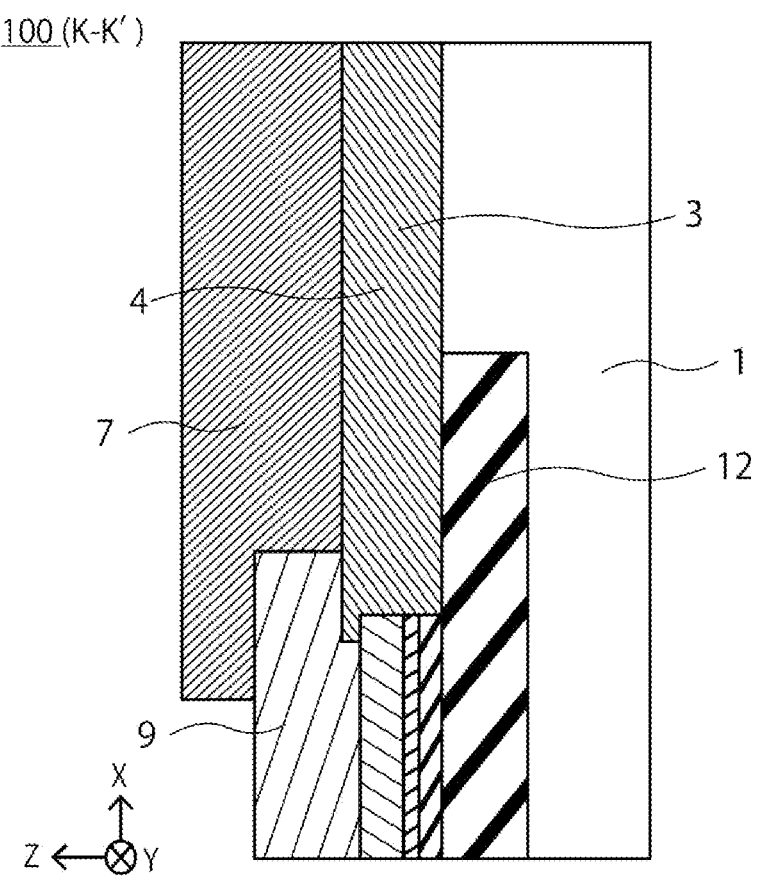
FIG. 11 is a schematic cross-sectional view of a semiconductor device according to an embodiment.
Figure 12:
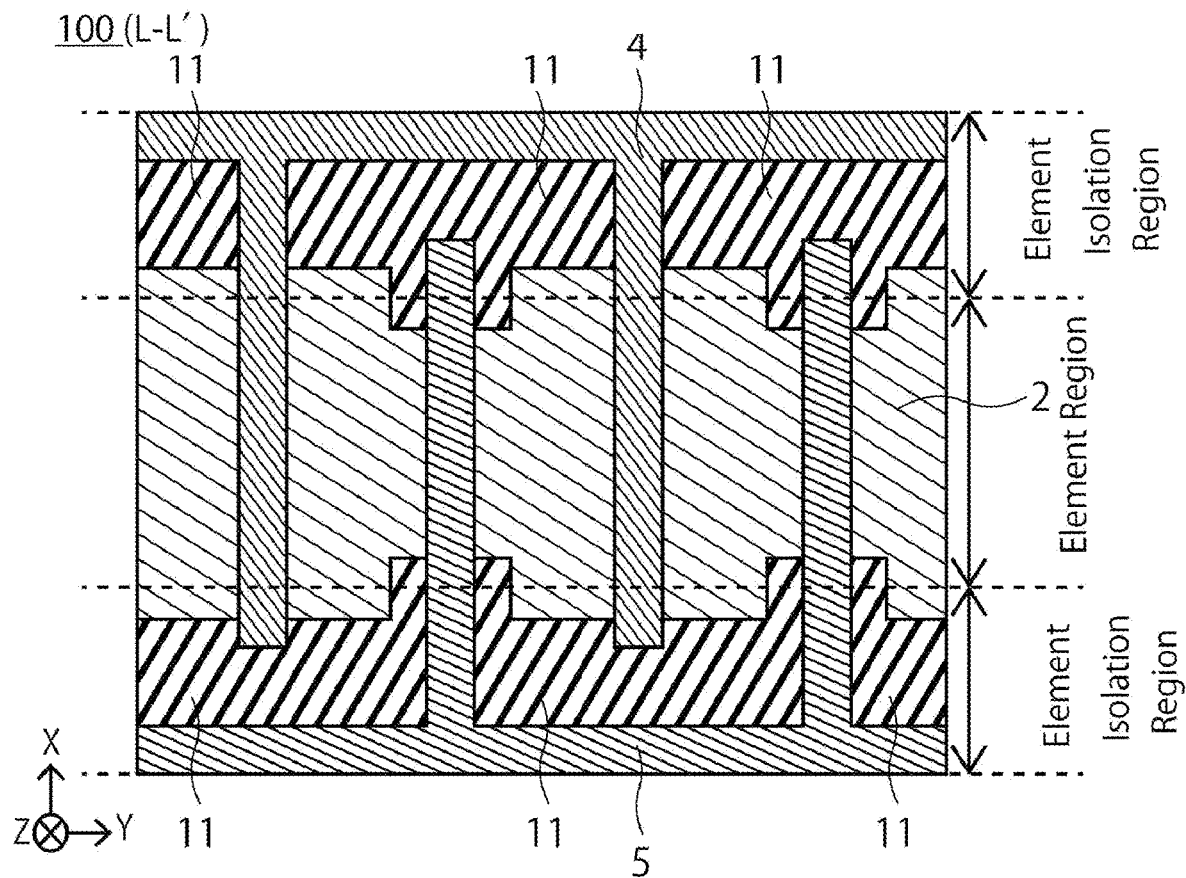
FIG. 12 is a schematic cross-sectional view of a semiconductor device according to an embodiment.

FIG. 1 is a schematic view of a semiconductor device 100 according to the first embodiment. FIGS. 2 to 12 are schematic cross-sectional views of the semiconductor device 100 of the first embodiment. FIG. 2 is a partial cross-sectional view taken along line A-A' of FIG. 1. FIG. 3 is a partial cross-sectional view taken along line B-B' in FIG. 1. FIG. 4 is a partial cross-sectional view taken along line C-C' in FIG. 1. FIG. 5 is a partial cross-sectional view taken along line D-D' in FIG. 1. FIG. 6 is a partial cross-sectional view taken along line E-E' of FIG. 1. FIG. 7 is a partial cross-sectional view taken along line F-F' of FIG. 1. FIG. 8 is a partial cross-sectional view taken along line G-G' in FIG. 1. FIG. 9 is a partial cross-sectional view taken along line H-H' in FIG. 1. FIG. 10 is a partial cross-sectional view taken along line J-J' in FIG. 1. FIG. 11 is a partial cross-sectional view taken along line K-K' in FIG. 1. FIG. 12 is a partial cross-sectional view taken along line L-L' of FIG. 2. In the cross-sectional view, the cross-sectional position is shown on the right side of the reference numeral of the target member (for example, in the case of FIG. 3, the semiconductor device 100) (for example, in the case of FIG. 3, 100 (B-B')).

The semiconductor device 100 is, for example, a high electron mobility transistor (HEMT) using the GaN-based semiconductor. The semiconductor device 100 includes an element region that operates as a transistor and a non-element region that does not operate as a transistor. In the semiconductor device 100, a region including a center portion defined by broken lines in FIG. 1 is an element region. In the semiconductor device 100, element isolation regions interposing the element region defined by the broken lines in FIG. 1 exist.

The semiconductor device 100 of FIG. 1 includes a semiconductor layer 1, a first insulation film 2, a first electrode 3, a second electrode 4, a third electrode 5, a first field plate electrode 6, a second field plate electrode 7, a third field plate electrode 8, second insulation films 11, a third insulation film 9, a fourth insulation film 10, and an element isolation region 12.

For example, the semiconductor layer 1 is formed by stacking a substrate 1A, a buffer layer 1B, a channel layer 1C (first nitride semiconductor layer), and a barrier layer 1D (second nitride semiconductor layer) in this order, and includes the element region and the element isolation region 12. The element isolation region 12 is provided from a surface of the barrier layer 1D of the semiconductor layer 1. A region in which the channel layer 1C of the semiconductor layer 1 and the element isolation region 12 of the barrier layer 1D are not provided is an element region. The substrate 1A is formed of, for example, silicon (Si). In addition to the silicon, for example, sapphire ($Al_2O_3$) or silicon carbide (SiC) can be applied.

The buffer layer 1B is provided on the substrate 1A. The buffer layer 1B has a function of reducing lattice mismatch between the substrate 1A and the channel layer 1C. The buffer layer 1B is formed in a multilayer structure of, for example, aluminum gallium nitride ($Al_wGa_{1-w}N$ ($0<W\leq1$)).

The channel layer 1C is provided on the buffer layer 1B. The channel layer 1C is also referred to as an electron transit layer. The channel layer 1C is, for example, undoped aluminum gallium nitride ($Al_xGa_{1-x}N$ ($0\leq X<1$)). More specifically, the channel layer 1C is, for example, undoped gallium nitride (GaN). A thickness of the channel layer 1C is, for example, 0.1 μm or greater and 10 μm or less. In the embodiment, the thickness is a length (height) of each member in a third direction (Z direction) that is a stacking direction of the channel layer 1C and the barrier layer 1D, the length including the channel layer 1C.

The barrier layer 1D is provided on the channel layer 1C. The barrier layer 1D is also referred to as an electron supply layer. A band gap of the barrier layer 1D is larger than a band gap of the channel layer 1C. The barrier layer 1D is, for example, undoped aluminum gallium nitride ($Al_yGa_{1-y}N$ ($0<Y\leq1$, $X<Y$)). More specifically, the barrier layer 1D is, for example, undoped $Al_{0.25}Ga_{0.75}N$. A thickness of the barrier layer 1D is, for example, 2 nm or greater and 100 nm or less.

A heterojunction interface is formed between the channel layer 1C and the barrier layer 1D. A two-dimensional electron gas (2DEG) is formed at the heterojunction interface and becomes a carrier of the semiconductor device 100.

The element isolation region 12 is a high resistance region formed by ion implantation. The element isolation region 12 is formed, for example, at least to the inside of the channel layer 1C. As ion species for separating elements, for example, nitrogen, argon, or the like can be applied. The dose amount associated with ion implantation is, for example, about $1\times10^{14}$ (ions/$cm^2$). Acceleration energy for performing ion implantation is, for example, about 100 keV or greater and 200 keV or less. A region in which the element isolation region 12 is formed (boundary between the element isolation region 12 and the element region) can be confirmed by cross-section observation using a transmission electron microscope (TEM) or the like.

The first electrode 3 is a gate electrode having a plurality of fingers extending in a first direction (X direction). Comb-shaped fingers of the gate electrode 3 extend in the first direction, and the fingers are arranged in a second direction (Y direction). The gate electrode 3 is an electrode provided on the first insulation film 2 provided on the channel layer 1C and the barrier layer 1D. The gate electrode 3 is electrically connected to the channel layer 1C and the barrier layer 1D. For example, the gate electrode 3 is in direct contact with an upper surface of the first insulation film 2. The gate electrode 3 is provided between the second electrode 4 and the third electrode 5. The gate electrode 3 or the first field plate electrode 6 is connected to the first electrode pad (gate electrode pad) 3A. When the first field plate electrode 6 is connected to the first electrode pad 3A, for example, the gate electrode 3 has a shape of only a finger portion.

The first direction intersects with the second direction and the third direction. The second direction intersects with the first direction and the third direction. It is preferably that the first direction is orthogonal to a plane formed by the second direction and the third direction, the second direction is orthogonal to a plane formed by the first direction and the third direction, and the third direction is orthogonal to a plane formed by the first direction and the second direction.

The gate electrode 3 is formed of, for example, titanium nitride (TiN).

A gate insulation film that is the first insulation film 2 may be provided between the gate electrode 3 and the barrier layer 1D, and the semiconductor device 100 may be a metal insulator semiconductor (MIS) type HEMT. A gate insulation film 2 is provided between the second electrode 4 and the third electrode 5. The gate insulation film 2 is preferably in direct contact with a surface of the barrier layer 1D on a side opposite to the channel layer 1C side and the gate electrode 3. The gate insulation film 2 is formed of, for example, an oxide or an oxynitride. The gate insulation film 2 is formed of, for example, silicon oxide ($SiO_2$), silicon nitride (SiN), aluminum oxide, silicon oxynitride, or aluminum oxynitride. The gate insulation film 2 is a dense insulation film. The gate insulation film 2 is an insulation film denser than the second insulation films 11. A density of the gate insulation film 2 is preferably, for example, 2 $g/cm^3$ or greater and 3.16 $g/cm^3$ or less. A thickness of the gate insulation film 2 is, for example, 10 nm or greater and 100 nm or less.

The semiconductor device 100 preferably includes the first field plate electrode 6. By providing the field plate electrode, electric field concentration on the electrode can be reduced. A portion surrounded by the broken line in FIG. 1 represents the first field plate electrode 6. The first field plate electrode 6 is a gate field plate electrode connected to the gate electrode 3.

The gate field plate electrode 6 is provided on the gate electrode 3. The gate field plate electrode 6 is electrically and directly connected to the gate electrode 3. The gate field plate electrode 6 includes, for example, a columnar portion in contact with the gate electrode 3 and a plate-like portion in contact with the columnar portion, and is provided with a step. The columnar portion is provided between the plate-like portion and the gate electrode 3. A width of the plate-like portion of the gate field plate electrode 6 in the second direction is preferably larger than a width of the gate electrode 3 in the second direction. A width of the columnar portion of the gate field plate electrode 6 in the second direction is preferably smaller than the width of the gate electrode 3 in the second direction. Another gate field plate electrode (not illustrated) connected to the gate electrode 3 can be provided between the gate field plate electrode 6 and the third electrode 5. An end surface of the gate field plate electrode 6 (including a gate field plate electrode used arbitrarily (not illustrated)) on the third electrode 5 side is preferably positioned closer to the second electrode 4 than an end surface of the second field plate electrode 7 on the third electrode 5 side in the second direction.

The second electrode 4 is a source electrode having a plurality of fingers extending in the first direction. Comb-shaped fingers of the source electrode 4 extend in the first direction, and the fingers are arranged in the second direction (Y direction). For example, the fingers of the source electrode 4 are provided between the fingers of the gate electrode 3. The source electrode 4 is provided on the semiconductor layer 1, more specifically, on the channel layer 1C and the barrier layer 1D. The source electrode 4 is preferably in direct contact with the surface of the barrier layer 1D on a side opposite to the channel layer 1C side. The source electrode 4 is electrically connected to the channel layer 1C and the barrier layer 1D. For example, the source electrode 4 or the second field plate electrode 7 is connected to a second electrode pad (source electrode pad) 4A. When the second field plate electrode 7 is connected to the second electrode pad 4A, for example, the source electrode 4 has a shape of only a finger portion.

The source electrode 4 is, for example, a metal electrode. The source electrode 4 is, for example, an aluminum film mainly containing aluminum and containing the aluminum in an amount of 50 wt % or more, and has a stacked structure of titanium (Ti) and aluminum (Al). It is desirable that an ohmic contact is formed between the source electrode 4 and the barrier layer 1D.

The semiconductor device 100 preferably includes the second field plate electrode 7. By providing the field plate electrode, electric field concentration on the electrode can be reduced. A portion surrounded by a two-dot chain line in FIG. 1 represents the second field plate electrode 7. The second field plate electrode 7 is a source field plate electrode connected to the source electrode 4. The source field plate electrode 7 is positioned above the source electrode 4 positioned in the middle or substantially in the middle of the source field plate electrode 7, the gate electrode 3, and the gate field plate electrode 6 so as to cover the source electrode 4, the gate electrode 3, and the gate field plate electrode 6, the source electrode 4 being interposed between the gate electrodes 3 and between the gate field plate electrodes 6.

The third electrode 5 is a drain electrode having a plurality of fingers extending in the first direction (X direction). Comb-shaped fingers of a drain electrode 5 extend in the first direction, and the fingers are arranged in the second direction (Y direction). A finger of the drain electrode 5 is provided in a direction opposite to a finger of the source electrode 4, that is, the source electrode 4 and the drain electrode 5 are provided so as to face each other. The drain electrode 5 is provided on the channel layer 1C and the barrier layer 1D. The drain electrode 5 is preferably in direct contact with the surface of the barrier layer 1D on a side opposite to the channel layer 1C side. The drain electrode 5 is electrically connected to the channel layer 1C and the barrier layer 1D. The drain electrode 5 is in contact with, for example, the barrier layer 1D. For example, the drain electrode 5 or the third field plate electrode 8 is connected to a third electrode pad (drain electrode pad) 5A. When the third field plate electrode 8 is connected to the third electrode pad 5A, for example, the drain electrode 5 has a shape of only a finger portion.

The drain electrode 5 is, for example, a metal electrode. The drain electrode 5 is, for example, an aluminum film mainly containing aluminum and containing the aluminum in an amount of 50 wt % or more, and has a stacked structure of titanium (Ti) and aluminum (Al). It is desirable that an ohmic contact is formed between the drain electrode 5 and the barrier layer 1D.

A distance between the source electrode 4 and the drain electrode 5 is, for example, 5 μm or greater and 30 μm or less.

The source electrode 4 and the drain electrode 5 may be in direct contact with the channel layer 1C.

The second insulation films 11 are insulation films provided between the gate electrode 3 and the semiconductor layer 1. The second insulation films 11 interpose the drain electrode 5 in the second direction. The second insulation films 11 are buffer films. The buffer films 11 preferably extend from the element isolation region to a part of the element region of the semiconductor layer 1. The buffer films 11 are provided between the semiconductor layer 1 of the element isolation region 12 and the gate electrode 3. The buffer films 11 are preferably in direct contact with the surface of the barrier layer 1D on a side opposite to the channel layer 1C side. A surface of the buffer films 11 on a side opposite to the barrier layer 1D side is preferably in direct contact with the surface of the barrier layer 1D on a side opposite to the channel layer 1C side. A side surface of the buffer films 11 (surface of the buffer films 11, which excludes the surface facing the Z direction) is preferably in direct contact with the gate electrode 3, the source electrode 4, and the drain electrode 5.

The buffer films 11 are formed of, for example, an oxide or an oxynitride. The buffer films 11 are formed of, for example, silicon oxide ($SiO_2$), silicon nitride (SiN), aluminum oxide, silicon oxynitride, or aluminum oxynitride. The buffer films 11 are insulation films having a low density. The buffer films 11 are insulation films having a density lower than that of the gate insulation film 2. A density of the buffer films 11 is preferably, for example, 2 $g/cm^3$ or greater and 3 $g/cm^3$ or less. The density ($g/m^3$) of the buffer films 11 is preferably 95% or less of the gate insulation film 2. A thickness of the buffer films 11 is larger than that of the gate insulation film 2, for example, 20 nm or greater and 500 nm or less.

The third insulation film 9 is an interlayer insulation film. The third insulation film 9 is provided between the gate insulation film 2 and the fourth insulation film 10. The third insulation film 9 coats the gate electrode 3, the source electrode 4, and the drain electrode 5. The third insulation film 9 is formed of, for example, an oxide or a nitride. The third insulation film 9 is formed of, for example, silicon oxide ($SiO_2$), silicon nitride (SiN), a high dielectric constant (high-k) material, or the like. An example of the high-k material includes hafnium oxide ($HfO_2$), or the like. The third insulation film 9 is an insulation film having a low density. The third insulation film 9 is an insulation film having a density lower than that of the gate insulation film 2. A density of the third insulation film 9 is preferably, for example, 2 $g/cm^3$ or greater and 3 $g/cm^3$ or less. The density ($g/m^3$) of the third insulation film 9 is preferably 95% or less of the gate insulation film 2. A thickness of the third insulation film 9 is larger than that of the gate insulation film 2, for example, 20 nm or greater and 500 nm or less.

The fourth insulation film 10 is an interlayer insulation film. The fourth insulation film 10 is provided on the third insulation film 9. The fourth insulation film 10 coats the gate field plate electrode 6, the source electrode 4, and the drain electrode 5. The fourth insulation film 10 is formed of, for example, an oxide or a nitride. The fourth insulation film 10 is formed of, for example, silicon oxide ($SiO_2$), silicon nitride (SiN), a high dielectric constant (high-k) material, or the like. An example of the high-k material includes hafnium oxide ($HfO_2$), or the like. The fourth insulation film 10 is an insulation film having a low density. The fourth insulation film 10 is an insulation film having a density lower than that of the gate insulation film 2. A density of the fourth insulation film 10 is preferably, for example, 2 $g/cm^3$ or greater and 3 $g/cm^3$ or less. The density ($g/m^3$) of the fourth insulation film 10 is preferably 95% or less of the gate insulation film 2. A thickness of the fourth insulation film 10 is larger than that of the gate insulation film 2, for example, 50 nm or greater and 2000 nm or less.

Kinds of elements in the semiconductor layer 1 and the semiconductor region, elements injected into the element isolation region 12, and an element concentration can be measured by, for example, a secondary ion mass spectrometry (SIMS) or an energy dispersive X-ray spectroscopy (EDX). The relative level of the element concentration can also be determined, for example, depending on the level of a carrier concentration obtained by a scanning capacitance microscopy (SCM). A distance such as a depth, a thickness, a width, and an interval of an impurity region can be obtained by, for example, SIMS. The distance such as a depth, a thickness, a width, and an interval of the impurity region can also be obtained from, for example, an image obtained by a comparison between a SCM image and an atom probe image.

Next, the buffer films 11, layers, and regions positioned around the buffer films 11 will be described. The buffer films 11 are provided mainly on the element isolation region 12. At a boundary between the element region and the element isolation region 12 of the semiconductor layer 1, the buffer films 11 are also provided on a part of the element region in the vicinity of the drain electrode 5. At the boundary between the element region and the element isolation region 12 of the semiconductor layer 1, the buffer films 11 are not provided on the element region side in the vicinity of the gate electrode 3. At the boundary between the element region and the element isolation region 12 of the semiconductor layer 1, there are a form in which the buffer films 11 are not provided on the element region side in the vicinity of the source electrode 4 and a form in which the buffer films 11 are also provided on a part of the element region.

The cross-sectional view of FIG. 2 illustrates a cross section positioned on the element region on which the buffer films 11 do not exist. The cross-sectional view of FIG. 3 illustrates a cross section positioned on the element region close to the element isolation region 12 on which the buffer films 11 interposing the drain electrode 5 exists. The same cross section as that in FIG. 3 continues to the boundary between the element region and the element isolation region 12. When entering the element isolation region 12, the element isolation region 12 appears on a surface side of the semiconductor layer 1 in the cross-sectional view of FIG. 3. In the cross section on the deeper side of the element isolation region 12, the buffer films 11 are also provided on a lower surface side of the gate electrode 3 and a side surface side of the source electrode 4.

An electric field is likely to concentrate on a boundary portion between the element region and the element isolation region 12, around tips of the fingers of the drain electrode 5. There is a possibility that the semiconductor layer 1 is deteriorated by the element isolation region 12, and the withstand voltage of the semiconductor layer 1 itself may decrease in the vicinity of the boundary between the element isolation region 12 and the element region of the semiconductor layer 1. When the element isolation region 12 is formed by using the gate insulation film 2, the gate insulation film 2 is directly connected on the element isolation region 12. However, in this case, since there is a possibility that the gate insulation film 2 is also be deteriorated due to the formation of the element isolation region 12, insulating properties of the gate insulation film 2 in the vicinity of the element region and the element isolation region 12 may be deteriorated. Therefore, it is preferable to improve the withstand voltage property of the insulation film on the semiconductor layer 1 to increase reliability of the semiconductor device 100 by providing the buffer films 11 at the boundary portion between the element region and the element isolation region 12, around the tips of the fingers of the drain electrode 5.

In order to improve the withstand voltage of a portion in which the electric field is likely to concentrate, it is preferable that the buffer films 11 have a side surface in contact with the drain electrode 5, and a side surface of the buffer films 11 on the side opposite to the side surface in contact with the drain electrode 5 is positioned between the source field plate electrode 7 and the drain field plate electrode 8 in the second direction as illustrated in the cross-sectional view of FIG. 3. Since the drain electrode 5 is in contact with the semiconductor layer 1 without the buffer films 11 sandwiched therebetween, as in the cross-sectional view of FIG. 4, a surface of the drain electrode 5 on the element region and the element isolation region 12, which faces the semiconductor layer 1 is not in contact with the buffer films 11, and a surface of an end portion of the drain electrode 5 in the first direction is in contact with the buffer films 11. At a root portion of each of the fingers of the drain electrode 5, the buffer films 11 are not provided between the drain electrode 5 and the semiconductor layer 1 as in the cross-sectional view of FIG. 9.

As illustrated in the cross-sectional view of FIG. 12, the buffer films 11 have a protruding portion having a width in the second direction from a side surface on the drain electrode 5 side on the element region. Therefore, as illustrated in the cross-sectional view of FIG. 5, the buffer films 11 interposing side surfaces of the drain electrode 5 on the element region are preferably overlapped with the drain field plate electrode 8 in the third direction in the vicinity of the boundary between the element region and the element isolation region 12.

It is preferable that the buffer films 11 interpose the drain electrode 5, and a side surface (S1 in FIG. 3) of the buffer films 11 on a side opposite to the side surface in contact with the drain electrode 5 is positioned between a surface (S2 in FIG. 3) of the drain field plate electrode 8 on the source field plate electrode 7 side and a surface (S3 in FIG. 3) of the source field plate electrode 7 on the drain field plate electrode 8 side in the second direction (S1 surface of the buffer films 11 is positioned on a reference line side of the S2 surface with respect to a reference line (two-dot chain line) of the S3 surface in a direction of a dashed arrow from the reference line (one-dot chain line) of the S2 surface). That is, as illustrated in the cross-sectional views of FIGS. 5, 6, and 11, it is preferable that the buffer films 11 on the side opposite to side surfaces in contact with the drain electrode 5 interpose the drain electrode 5, and a side surface on the side opposite to the side surface in contact with the drain electrode 5 is at a position not overlapped with the source field plate electrode 7 and the drain field plate electrode 8 in the third direction.

More specifically, it is preferable that the buffer films 11 interpose the drain electrode 5, and the side surface (S1 in FIG. 3) on the side opposite to the side surface in contact with the drain electrode 5 is positioned at a distance of 0.1 µm or greater and 20 µm or less from the surface (S2 in FIG. 3) on the source field plate electrode 7 side of the drain field plate electrode 8 toward the source field plate electrode 7 in the second direction (in a direction of the dashed arrow) (S1 surface of the buffer films 11 is positioned on the reference line side of the S2 with respect to the reference line of the S3 surface (two-dot chain line) in the direction of the dashed arrow from the reference line of the S2 surface (one-dot chain line), and positioned at a distance of 0.1 µm or greater and 20 µm or less in the direction of the dashed arrow from the S2 surface). When the side surface of the buffer films 11 on the side opposite to the side surface in contact with the drain electrode 5 is positioned on the drain electrode 5 side in the second direction, the withstand voltage is likely to decrease. Therefore, it is more preferable that the buffer films 11 interpose the drain electrode 5 and the side surface of the buffer films 11 on the side opposite to the side surface in contact with the drain electrode 5 is positioned at a distance of 0.1 µm or greater and 12 µm or less from the surface on the source field plate electrode 7 side of the drain field plate electrode 8 toward the source field plate electrode 7 in the second direction.

The buffer films 11 are preferably provided to a position at a distance (L1 in FIG. 5) of 0.1 µm or greater and 3.0 µm or less from the boundary between the element region and the element isolation region 12 in an element region direction (first direction) in a portion in which the drain electrode 5 is interposed. When the buffer films 11 are not provided on the element region side with respect to the boundary between the element region and the element isolation region 12 in the portion in which the drain electrode 5 is interposed, the withstand voltage of the buffer films 11 is hardly improved. When a large number of the buffer films 11 are formed on the element region, the substantial element region is reduced. The buffer films 11 are more preferably provided to a position at a distance of 0.1 µm or greater and 0.5 µm or less from the boundary between the element region and the element isolation region 12 in an element region direction (first direction) in a portion in which the drain electrode 5 is interposed.

From the viewpoint of widening an effective element region, it is preferable that the buffer films 11 interpose the drain electrode 5 at least on the element isolation region 12, and in a portion in which the drain electrode 5 is interposed, the buffer films 11 are not provided in a position at a distance of more than 3.0 µm on the element region side from the boundary between the element region and the element isolation region 12 toward the first direction (in the portion in which the buffer films 11 interpose the drain electrode 5, a length of the buffer films 11 protruding on the element region side from the boundary between the element region and the element isolation region 12 toward the first direction is 3.0 µm at maximum), and it is more preferable that the buffer films 11 are not provided in a position at a distance of more than 0.1 µm (in the portion in which the buffer films 11 interpose the drain electrode 5, a length of the buffer films 11 protruding from the boundary between the element region and the element isolation region 12 toward the first direction is 0.1 µm at maximum). In a portion in which the buffer films 11 are not provided between the drain electrode 5 and the semiconductor layer 1, the drain electrode 5 is in contact with the semiconductor layer 1. From the viewpoint of widening the effective element region, an area of the surface on which the buffer films 11 are in contact with the semiconductor layer 1 on the element region is preferably 10% or less of an area of a surface of the semiconductor layer 1 on the gate insulation film 2 side of the element region, and more preferably is 5% or less.

As illustrated in the cross-sectional views of FIGS. 7 and 10, the buffer films 11 are preferably not provided between the semiconductor layer 1 on the element region and the gate insulation film 2 under the gate electrode 3. FIG. 7 is a cross-sectional view of a root portion of the finger of the gate electrode 3. FIG. 10 is a cross-sectional view of a tip portion of the finger of the gate electrode 3. The cross-sectional views of FIGS. 7 and 10 show a cross section at a position not including the columnar portion of the gate field plate electrode 6. The gate insulation film 2 and the semiconductor layer 1 are in contact with each other in a portion in which the buffer films 11 are not provided between the gate insulation film 2 under the gate electrode 3 and the semiconductor layer 1.

In a case where the buffer films 11 are provided between the semiconductor layer 1 on the element region and the gate insulation film 2 under the gate electrode 3, when semiconductor device 100 is a normally-off type, the semiconductor device 100 is less likely to be turned off in the vicinity of the element isolation region 12. When a gate cannot be turned off by the buffer films 11, leakage occurs in the vicinity of the element isolation region 12. Therefore, it is preferable that the buffer films 11 are not provided under the gate electrode 3 on the element region. From a viewpoint of improving reliability of the semiconductor device 100 on the basis of the above viewpoint, it is preferable that the buffer films 11 between the semiconductor layer 1 and the gate insulation film 2 under the gate electrode 3 is not provided to a position at a distance of 0.1 µm or greater and 3.0 µm or less on the element isolation region 12 side from the boundary between the element region and the element isolation region 12 toward the first direction (distance (L2 in FIG. 7) from the boundary between the element region and the element isolation region 12 to the buffer films 11 between the semiconductor layer 1 and the gate insulation film 2 under the gate electrode 3 is 0.1 µm or greater and 3.0 µm or less), and it is more preferable that the buffer films 11 are not provided to a position at a distance of 0.1 µm or greater and 0.5 µm or less (distance (L2 in FIG. 7) from the boundary between the element region and the element isolation region 12 to the buffer films 11 between the semiconductor layer 1 and the gate insulation film 2 under the gate electrode 3 is 0.1 µm or greater and 0.5 µm or less).

The buffer films 11 interpose the root portion and the tip portion of the finger of the source electrode 4 at least on the element isolation region 12. As illustrated in the cross-sectional views of FIGS. 8, 11, and 12, on the element isolation region 12 of the semiconductor layer 1, the buffer films 11 are not provided between the source electrode 4 and the semiconductor layer 1.

Next, a method for manufacturing the semiconductor device 100 will be described with reference to process step cross-sectional views of FIGS. 13 to 29. The method for manufacturing a semiconductor device 100 includes the steps of: forming the buffer films 11 on the semiconductor layer 1; forming the element isolation region 12 on the semiconductor layer 1 on which the buffer films 11 are formed via the buffer films 11; patterning the buffer films 11; forming the gate insulation film 2 on the patterned buffer films 11 and the semiconductor layer 1; forming the gate electrode 3 on the gate insulation film 2 and the buffer films 11; forming the third insulation film 9; opening the insulation film on the semiconductor layer 1; forming the source electrode 4, the drain electrode 5, and the gate field plate electrode 6; forming the fourth insulation film 10; opening the insulation film on the source electrode 4 and the drain electrode 5; and forming the source field plate electrode 7 and the drain field plate electrode 8. In the process step cross-sectional view, the cross-sectional position is shown on the right side of the reference numeral of the target member (for example, in the case of FIG. 15, a member 101) (for example, in the case of FIG. 15, 101 (L-L')).

First, the step of forming the buffer films 11 on the semiconductor layer 1 includes forming the buffer films 11 on the barrier layer 1D of the semiconductor layer 1 by, for example, a plasma-enhanced chemical vapor deposition (PE-CVD) method. Since the insulation film is formed by the PE-CVD method, a low-density insulation film can be formed.

The step of forming, via the buffer films 11, the element isolation region 12 on the semiconductor layer 1 on which the buffer films 11 are formed includes performing ion implantation of nitrogen or argon into the surface of the semiconductor layer 1 of a member on which the buffer films 11 are formed. The ion implantation is performed from the surface of the buffer films 11. Acceleration energy for performing ion implantation is, for example, about 100 keV or greater and 200 keV or less. By performing the ion implantation, the buffer films 11 are deteriorated, and the withstand voltage of the buffer films 11 itself is lowered. Since the element isolation region 12 is not formed via the gate insulation film 2, from the viewpoint of improving the reliability of the semiconductor device 100, it is preferable that the gate insulation film 2 is not deteriorated due to the formation of the element isolation region 12.

Figure 13:
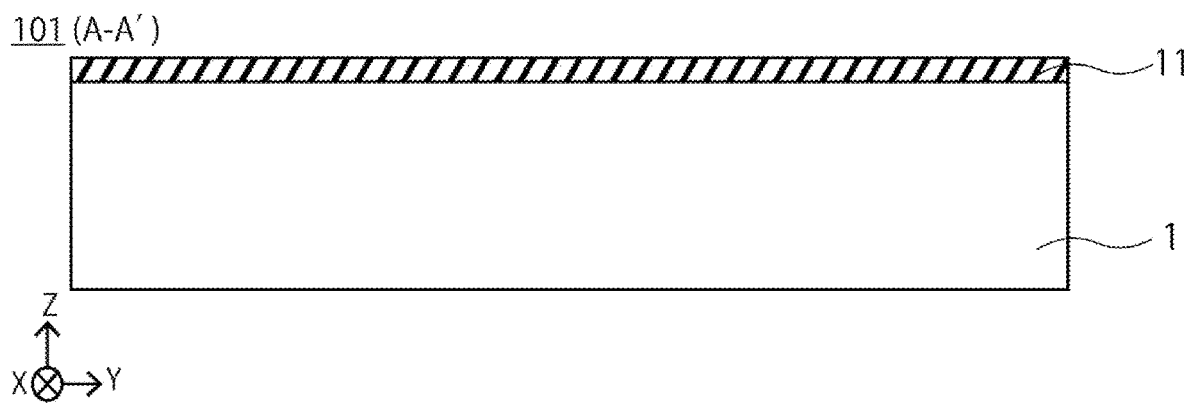
FIG. 13 is a process step cross-sectional view of a semiconductor device according to an embodiment.
Figure 14:
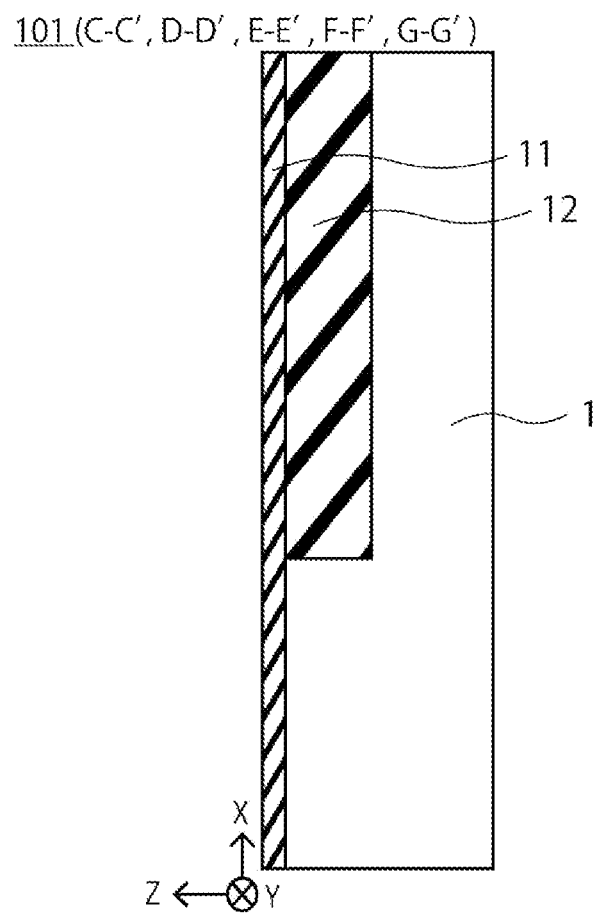
FIG. 14 is a process step cross-sectional view of a semiconductor device according to an embodiment.
Figure 15:
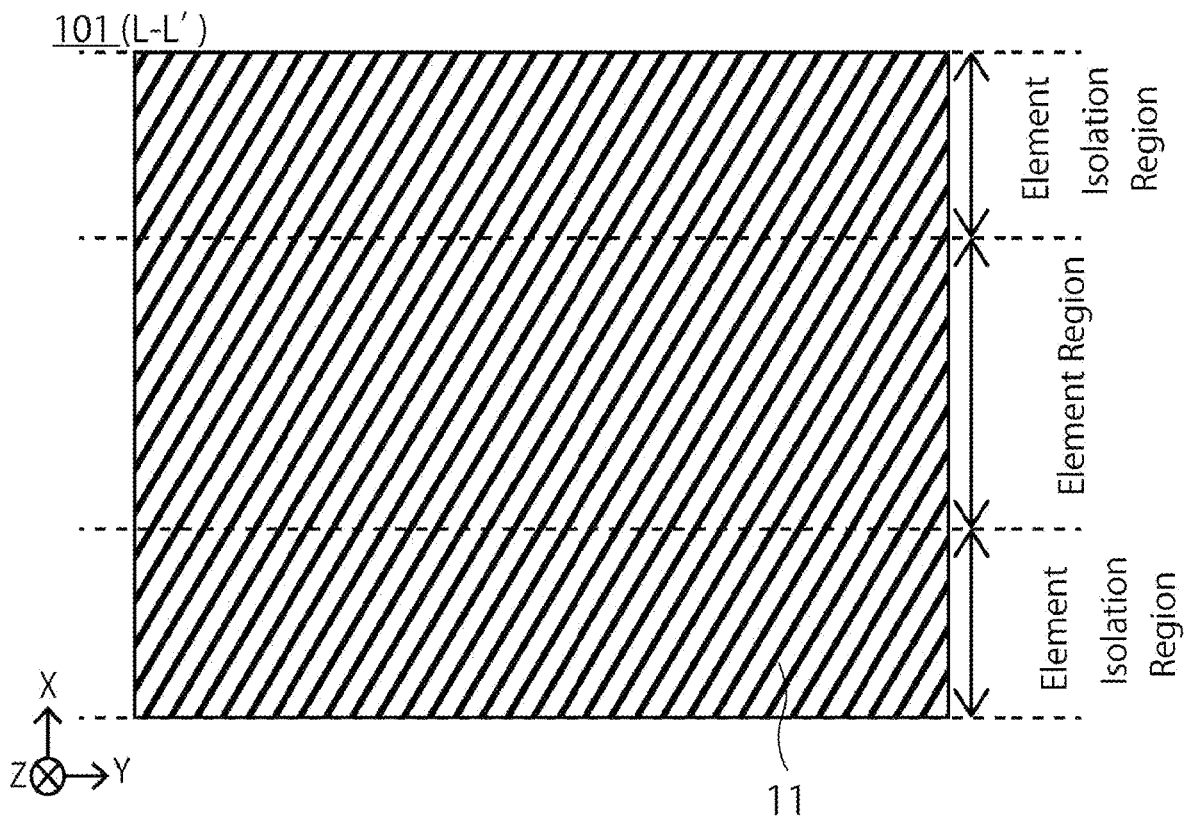
FIG. 15 is a process step cross-sectional view of a semiconductor device according to an embodiment.

By performing the step of forming, via the buffer films 11, the element isolation region 12 on the semiconductor layer 1 on which the buffer films 11 are formed, the member 101 illustrated in the process step cross-sectional views of the semiconductor device of FIGS. 13, 14, and 15 is obtained. FIG. 13 is a partial cross-sectional view of the member 101 corresponding to a position taken along line A-A' in FIG. 1. FIG. 14 is a partial cross-sectional view of the member 101 corresponding to positions taken along lines C-C', D-D', E-E', F-F', and G-G' in FIG. 1. FIG. 15 is a partial cross-sectional view of the member 101 corresponding to a position taken along line L-L' in FIG. 2.

Since the member 101 is in a state before the patterning of the buffer films 11, the buffer films 11 are formed on the entire surface of the semiconductor layer 1 including the element region as illustrated in FIG. 15. Therefore, the buffer films 11 are also provided in the partial cross-sectional view corresponding to the position taken along line A-A'. The same applies to any partial cross-sectional views corresponding to the positions taken along lines C-C', D-D', E-E', F-F', and G-G'.

In the step of patterning the buffer films 11, for example, a part of the buffer films 11 is removed by using a mask. On the element region, a part of the buffer films 11 on the element isolation region 12 is removed except for the buffer films 11 of a portion in which the drain electrode 5 is interposed and a portion in which the drain electrode 5 interposed between the buffer films 11 is formed, so that the buffer films 11 in the portion in which the drain electrode 5 is interposed and the portion in which the drain electrode 5 interposed between the buffer films 11 is formed remains. In this patterning, a shape of the buffer films 11, in which the portion in which the drain electrode 5 is interposed and the gate electrode 3 side are recessed, is formed.

The patterning of the buffer films 11 is performed so that the semiconductor layer 1 is exposed up to a part of the element isolation region 12 in a portion in which the gate electrode 3 and the source electrode 4 are formed and its periphery and the semiconductor layer 1 is exposed up to a part of the element region in a portion in which the drain electrode 5 is formed and its periphery.

The step of forming the gate insulation film 2 on the patterned buffer films 11 and the semiconductor layer 1 includes forming the gate insulation film 2 on the buffer films 11 and the semiconductor layer 1 exposed by the patterning by, for example, a low-pressure chemical vapor deposition (LP-CVD) method. In the step, a member 102 illustrated in the process step cross-sectional views of FIGS. 16 to 19 is obtained. Since the buffer films 11 are patterned after the formation of the element isolation region 12 and the element isolation region 12 is not formed via the gate insulation film 2, a defect due to the ion implantation into the element isolation region 12 does not occur in the gate insulation film 2 even in the manufactured semiconductor device 100, which is preferable from the viewpoint of the withstand voltage.

Figure 16:
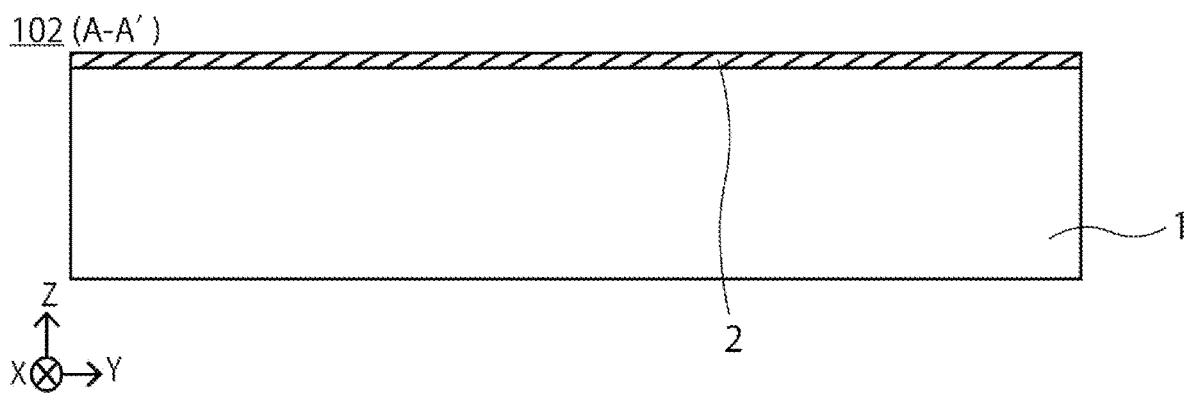
FIG. 16 is a process step cross-sectional view of a semiconductor device according to an embodiment.
Figure 17:
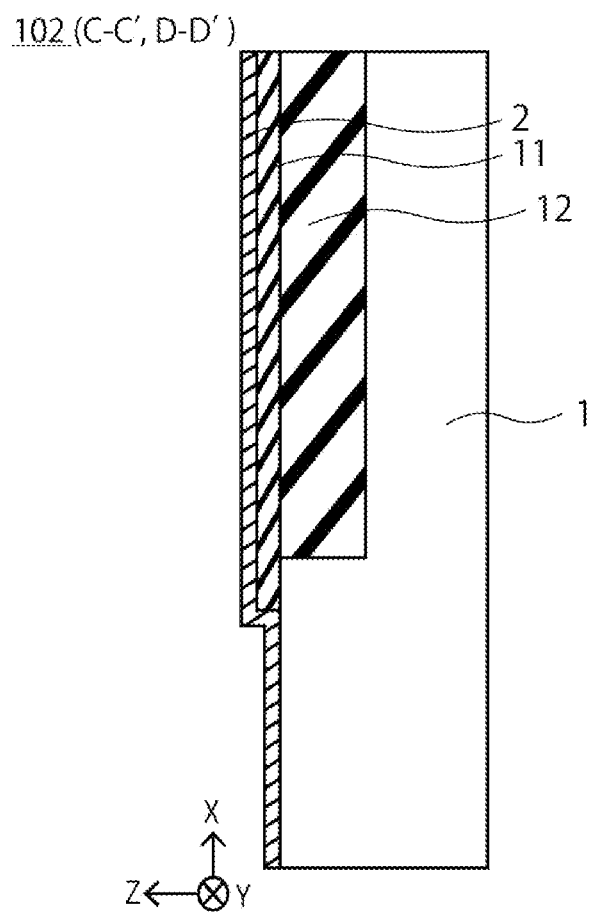
FIG. 17 is a process step cross-sectional view of a semiconductor device according to an embodiment.
Figure 18:
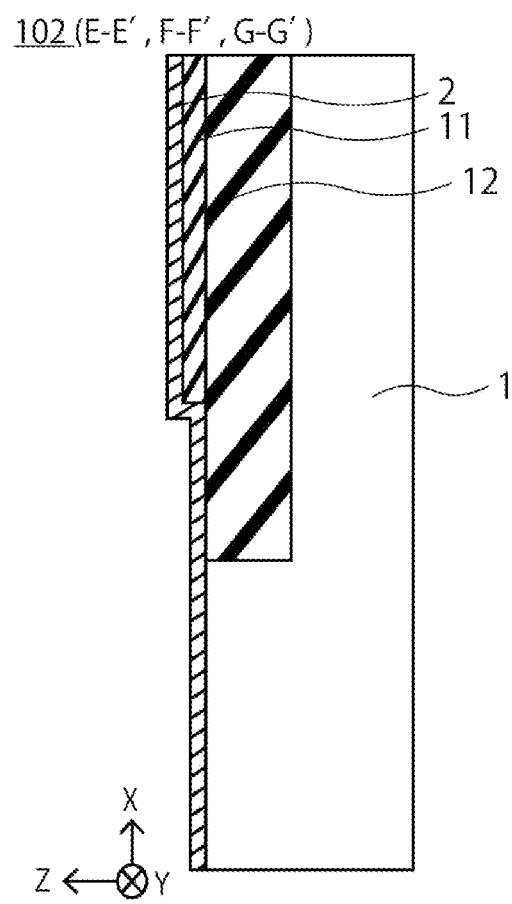
FIG. 18 is a process step cross-sectional view of a semiconductor device according to an embodiment.
Figure 19:
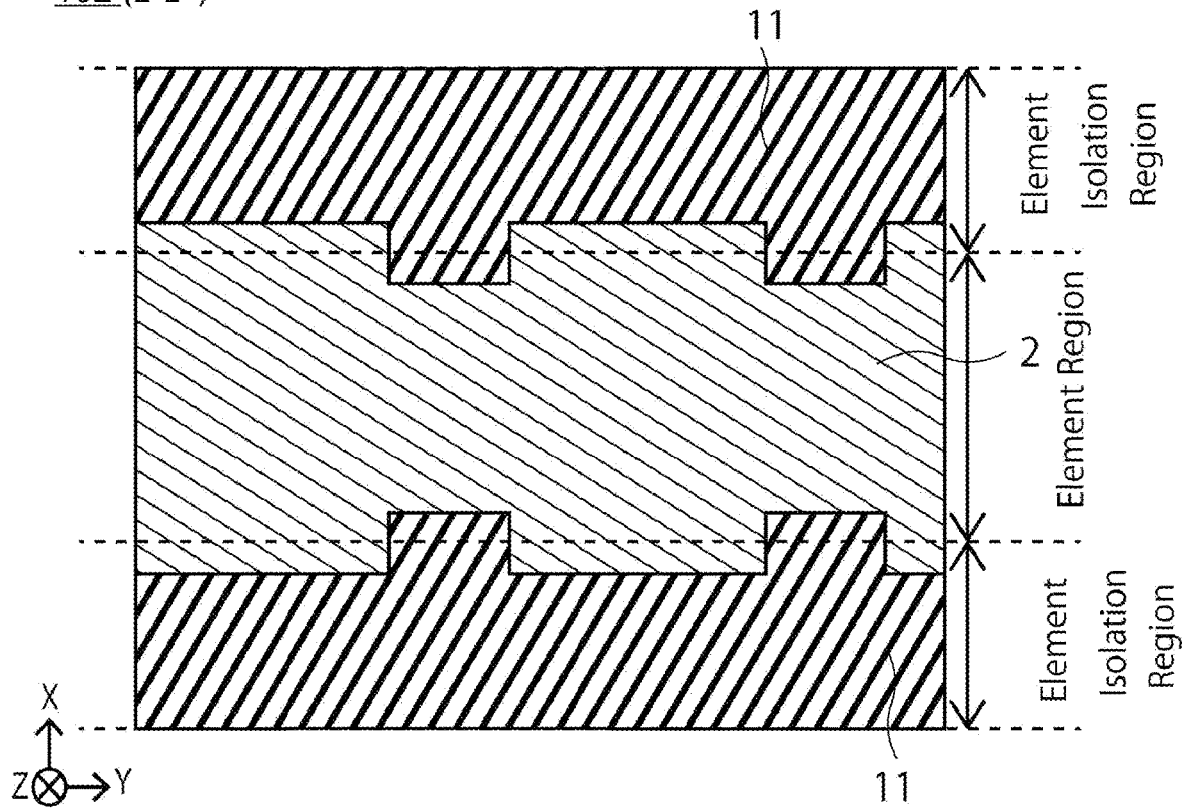
FIG. 19 is a process step cross-sectional view of a semiconductor device according to an embodiment.

FIG. 16 is a partial cross-sectional view of the member 102 corresponding to a position taken along line A-A' in FIG. 1. FIG. 17 is a partial cross-sectional view of the member 102 corresponding to positions taken along lines C-C', and D-D' in FIG. 1. FIG. 18 is a partial cross-sectional view of the member 102 corresponding to positions taken along lines E-E', F-F', and G-G' in FIG. 1. FIG. 19 is a partial cross-sectional view of the member 102 corresponding to a position taken along line L-L' in FIG. 2.

In a portion in which the gate electrode 3 is formed, since the surface of the semiconductor layer 1 is exposed up to a part of the element isolation region 12 by the patterning of the buffer films 11, the gate insulation film 2 is formed directly on the semiconductor layer 1. The gate insulation film 2 is also formed on the buffer films 11 remaining in the patterning.

Since the buffer films 11 are patterned as described above, as illustrated in FIG. 17, the buffer films 11 in FIG. 13 are replaced with the gate insulation film 2, and processing is performed as illustrated in the cross-sectional views of FIGS. 17 and 18, in which positions in which the buffer films 11 are provided are different. Accordingly, as illustrated in the cross-sectional view of FIG. 19, the buffer films 11 are also formed on the element region in the portion in which the drain electrode 5 is formed, and the buffer films 11 are not formed on the element region in the other peripheral portion formed by the gate electrode 3 and the source electrode 4. Therefore, a surface formed by the first direction and the second direction of the buffer films 11 and the gate insulation film 2 is formed in a shape recessed from the boundary between the element region and the element isolation region 12 toward the element isolation region 12.

The step of forming the gate electrode 3 on the gate insulation film 2 and the buffer films 11 includes forming a metal film of the gate electrode 3 on the gate insulation film 2 and the buffer films 11, and patterning the gate electrode 3.

The step of forming the third insulation film 9 includes forming a third insulation film on the gate insulation film 2 and the gate electrode 3 of the member on which the gate electrode 3 is formed. Then, a member 103 illustrated in the process step cross-sectional views of FIGS. 20 to 22 in which the gate insulation film 2 and the gate electrode 3 are covered with the third insulation film 9 is obtained. As the third insulation film 9, for example, a low-density insulation film is formed by the plasma-enhanced chemical vapor deposition (PE-CVD) method.

Figure 20:
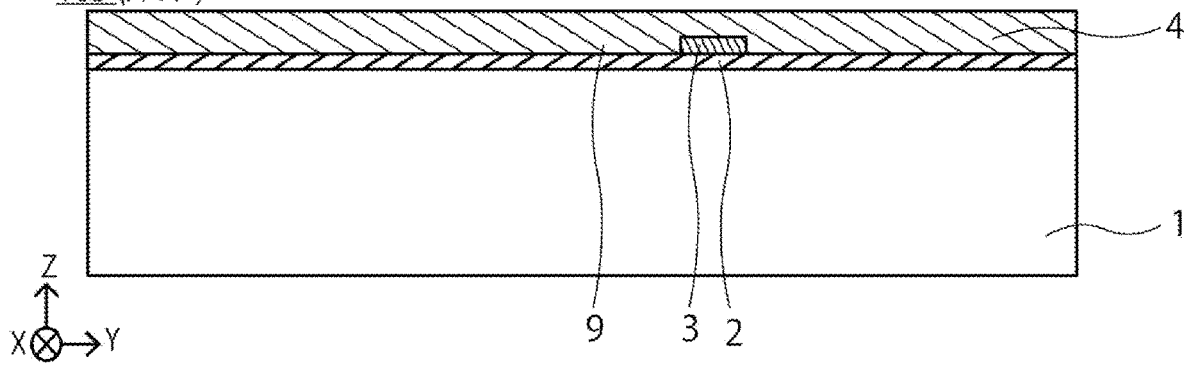
FIG. 20 is a process step cross-sectional view of a semiconductor device according to an embodiment.
Figure 21:
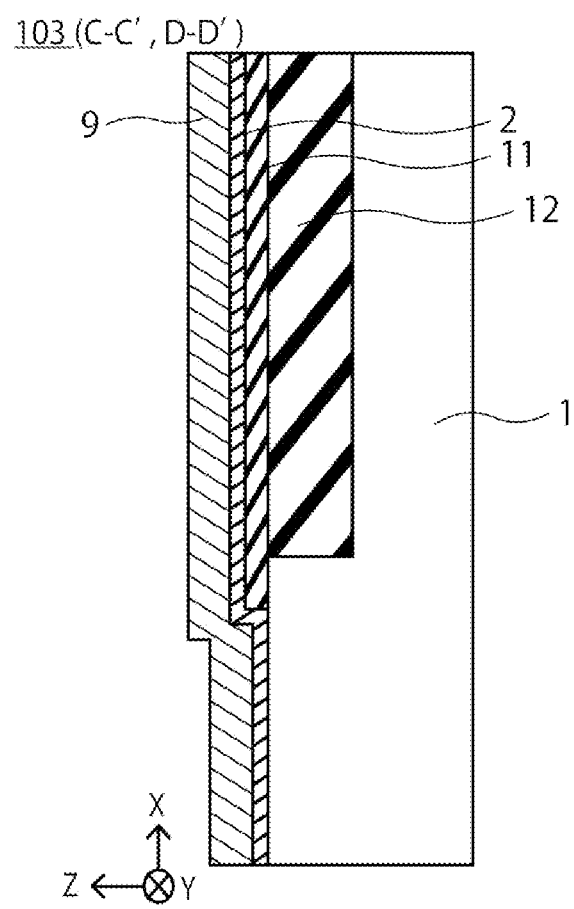
FIG. 21 is a process step cross-sectional view of a semiconductor device according to an embodiment.
Figure 22:
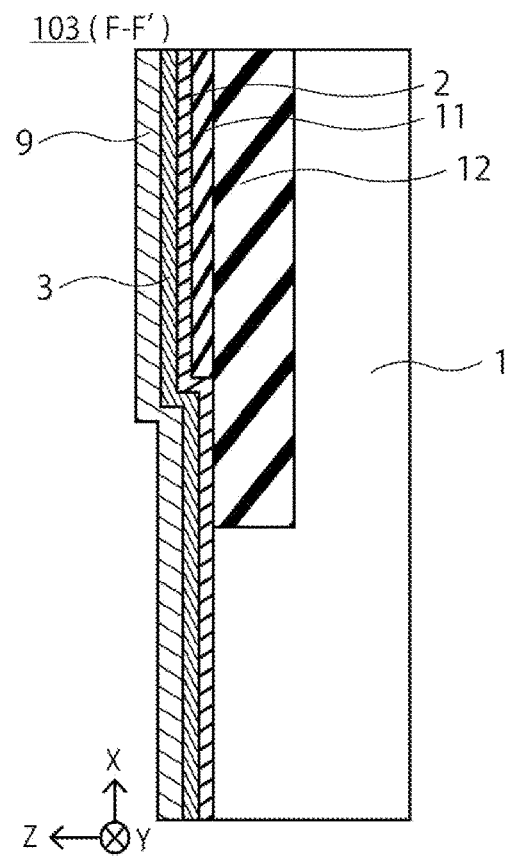
FIG. 22 is a process step cross-sectional view of a semiconductor device according to an embodiment.

FIG. 20 is a partial cross-sectional view of the member 103 corresponding to a position taken along line A-A' in FIG. 1. FIG. 21 is a partial cross-sectional view of the member 103 corresponding to positions taken along lines C-C', and D-D' in FIG. 1. FIG. 22 is a partial cross-sectional view of the member 103 corresponding to a position taken along line F-F' in FIG. 1.

In the member 103, for example, the third insulation film 9 is formed on the gate insulation film 2 of the member 103 as illustrated in FIG. 21, except for the position in which the gate electrode 3 is formed. In the portion in which the gate electrode 3 is formed, as illustrated in FIG. 22, the gate electrode 3 is sandwiched between the gate insulation film 2 and the third insulation film 9.

The step of opening the insulation film on the semiconductor layer 1 includes removing a part of the buffer films 11, the gate insulation film 2, and the third insulation film 9 in order to form the source electrode 4, the drain electrode 5, and the gate field plate electrode 6. In accordance with the shapes of the source electrode 4 and the drain electrode 5, a part of the buffer films 11, the gate insulation film 2, and the third insulation film 9 is removed so that the surface of the semiconductor layer 1 is exposed, and in accordance with the shape of the columnar portion of the gate field plate electrode 6, a part of the third insulation film 9 is removed so that the surface of the gate electrode 3 is exposed. Then, a member 104 illustrated in the process step cross-sectional views of FIGS. 23 to 26 in which the insulation film on the semiconductor layer 1 is partially opened is obtained.

Figure 23:
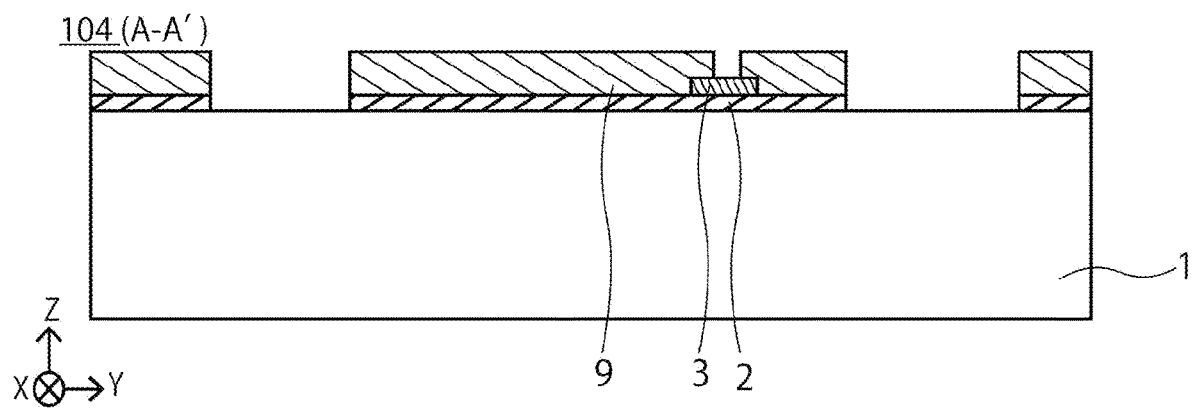
FIG. 23 is a process step cross-sectional view of a semiconductor device according to an embodiment.
Figure 24:
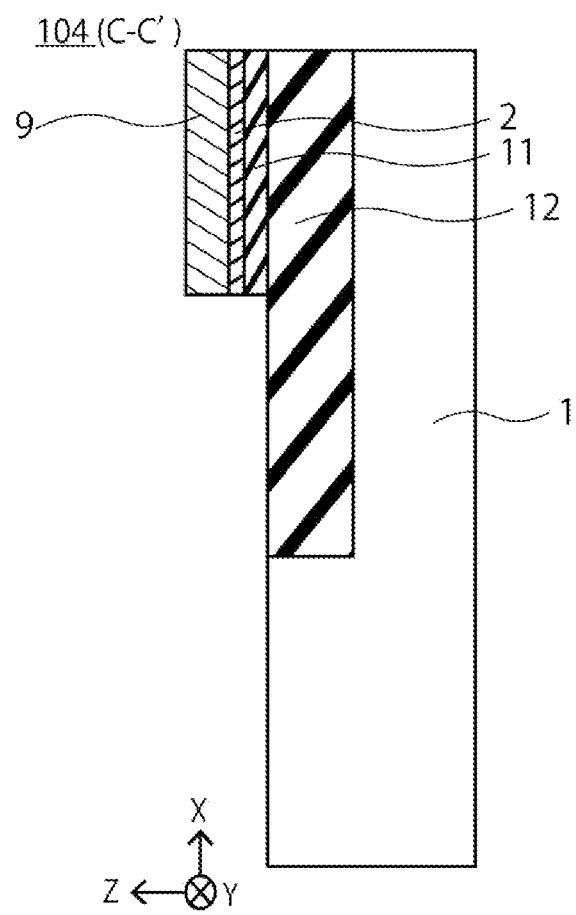
FIG. 24 is a process step cross-sectional view of a semiconductor device according to an embodiment.
Figure 25:
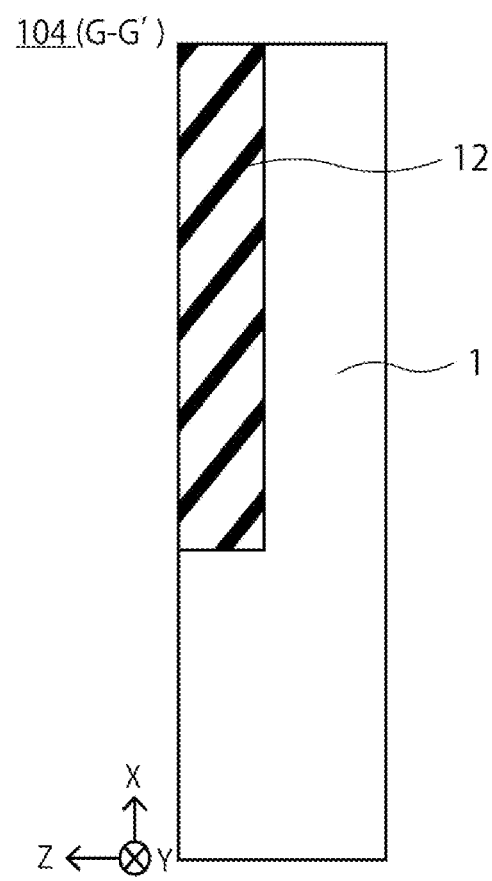
FIG. 25 is a process step cross-sectional view of a semiconductor device according to an embodiment.
Figure 26:
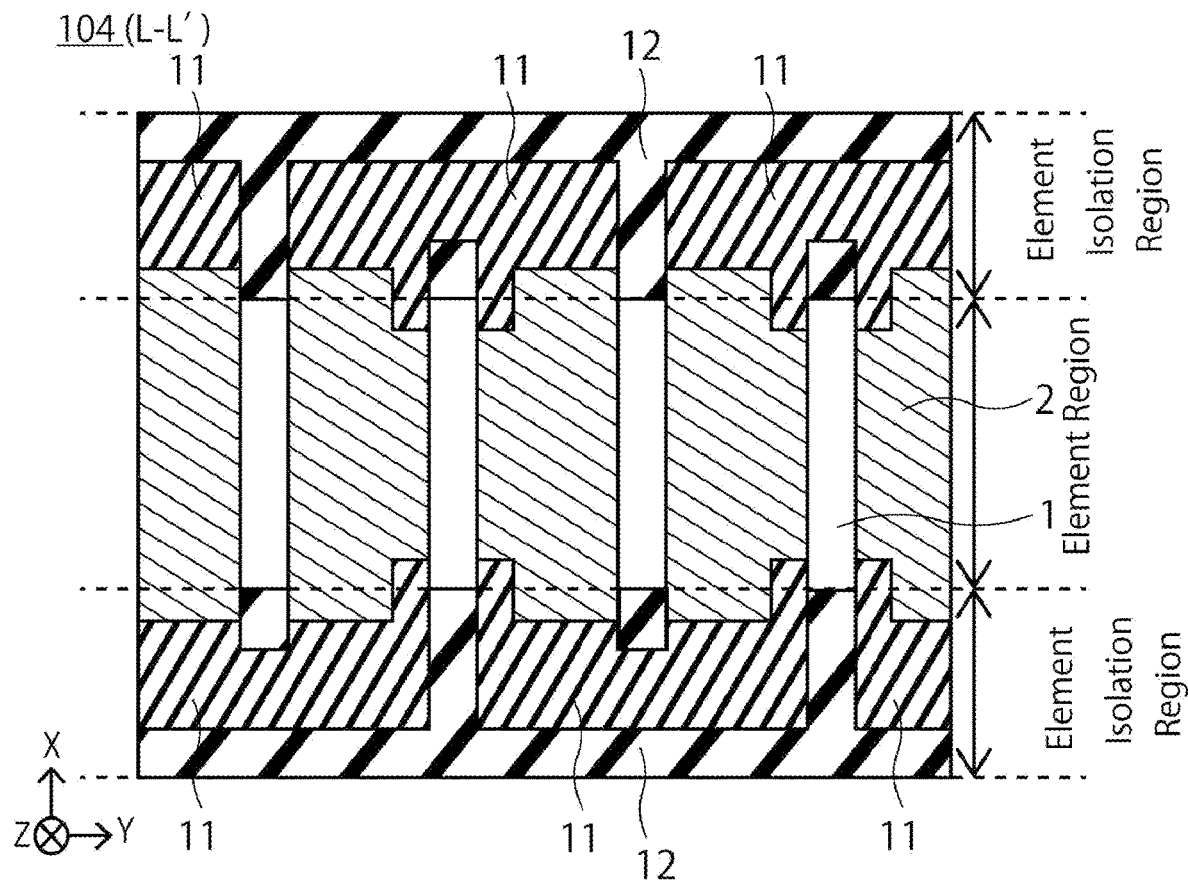
FIG. 26 is a process step cross-sectional view of a semiconductor device according to an embodiment.

FIG. 23 is a partial cross-sectional view of the member 104 corresponding to a position taken along line A-A' in FIG. 1. FIG. 24 is a partial cross-sectional view of the member 104 corresponding to a position taken along line C-C' in FIG. 1. FIG. 25 is a partial cross-sectional view of the member 104 corresponding to a position taken along line G-G' in FIG. 1. FIG. 26 is a partial cross-sectional view of the member 104 corresponding to a position taken along line L-L' in FIG. 2.

In a region in which the columnar portion of the gate field plate electrode 6 of the member 104 is formed, as illustrated in the cross-sectional view of FIG. 23, a groove extending in the first direction and having the gate electrode 3 exposed on a bottom surface thereof is formed.

In a region in which the source electrode 4 and the drain electrode 5 of the member 104 are formed, the buffer films 11 and the gate insulation film 2 are removed on the element region, and a groove in which the semiconductor layer 1 is exposed on the bottom surface is formed. For example, as illustrated in the cross-sectional view of FIG. 24, in a region in which the source electrode 4 and the drain electrode 5 of the member 104 are formed, the buffer films 11 and the gate insulation film 2 partially remain so that a tip portion of the finger on the element isolation region 12 is in contact with the buffer films 11 and the gate insulation film 2. For example, as illustrated in the cross-sectional view of FIG. 25, the buffer films 11 and the gate insulation film 2 are removed so that side surfaces of ends of the source electrode 4 and the drain electrode 5 are in contact with the buffer films 11 and the gate insulation film 2 in accordance with the shapes of the source electrode 4 and the drain electrode 5 at the root portion of the finger. As illustrated in the cross-sectional view of FIG. 26, the surface of the semiconductor layer 1 is exposed in a region in which the source electrode 4 and the drain electrode 5 of the member 104 are formed.

The step of forming the source electrode 4, the drain electrode 5, and the gate field plate electrode 6 includes forming a metal film of the source electrode 4, the drain electrode 5, and the gate field plate electrode 6 on the portion opened in the step of opening the insulation film on the semiconductor layer 1 and the third insulation film 9, and patterning the metal film according to each electrode shape. Then, a member 105 illustrated in the process step cross-sectional views of FIGS. 27 to 29 in which the source electrode 4, the drain electrode 5, and the gate field plate electrode 6 are formed is obtained.

Figure 27:
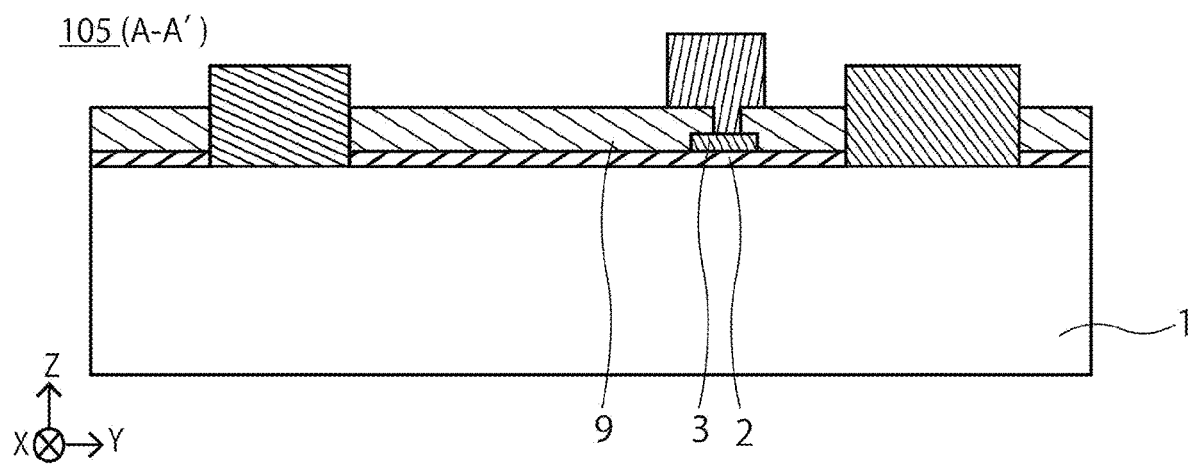
FIG. 27 is a process step cross-sectional view of a semiconductor device according to an embodiment.
Figure 28:
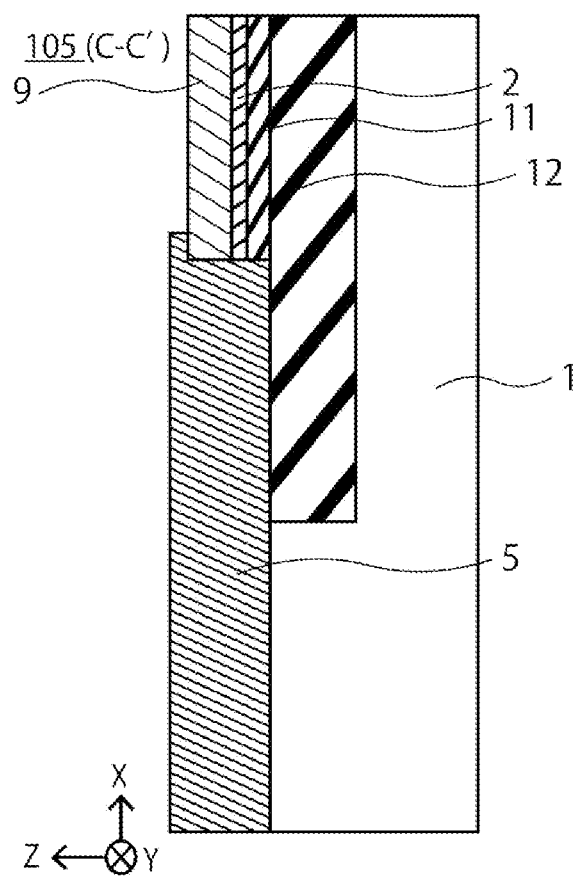
FIG. 28 is a process step cross-sectional view of a semiconductor device according to an embodiment.
Figure 29:
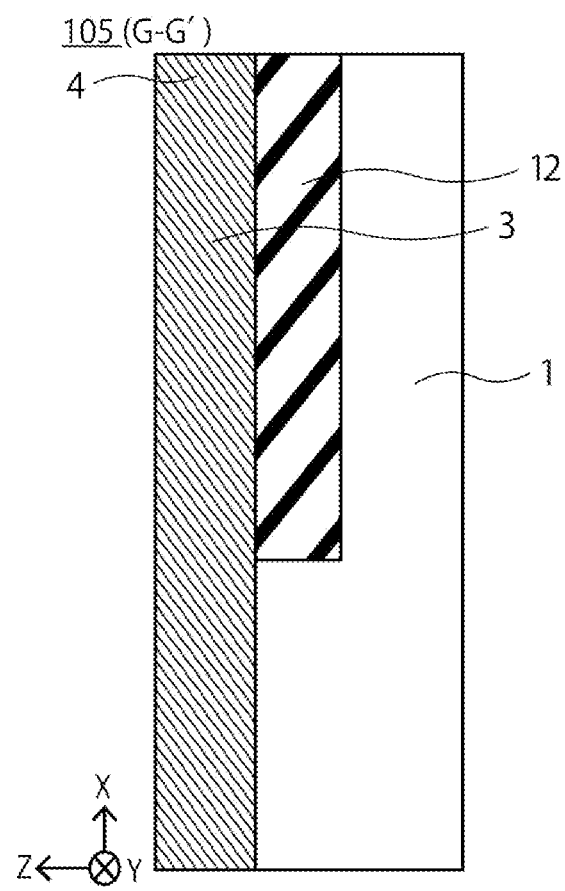
FIG. 29 is a process step cross-sectional view of a semiconductor device according to an embodiment.

FIG. 27 is a partial cross-sectional view of the member 105 corresponding to a position taken along line A-A' in FIG. 1. FIG. 28 is a partial cross-sectional view of the member 105 corresponding to a position taken along line C-C' in FIG. 1. FIG. 29 is a partial cross-sectional view of the member 105 corresponding to a position taken along line G-G' in FIG. 1. As illustrated in FIG. 27, in the member 105, the source electrode 4, the drain electrode 5, and the gate field plate electrode 6 are formed in a groove of the member 104. In the tip portion of the finger, for example, as illustrated in FIG. 28, the drain electrode 5 is formed also on a part of the semiconductor layer 1 and the third insulation film 9, which are exposed. For example, as illustrated in FIG. 29, the source electrode 4 is formed on the exposed semiconductor layer 1.

The step of forming the fourth insulation film 10 includes forming the fourth insulation film 10 on the source electrode 4, the drain electrode 5, the gate field plate electrode 6, and the third insulation film 9. As the fourth insulation film 10, for example, a low-density insulation film is formed by the plasma-enhanced chemical vapor deposition (PE-CVD) method.

The step of opening the insulation film on the source electrode 4 and the drain electrode 5 includes removing a part of the fourth insulation film 10 in order to form the source field plate electrode 7 and the drain field plate electrode 8. A part of the fourth insulation film 10 is removed according to the shape of the columnar portion of the source field plate electrode 7 so that the surface of the source electrode 4 is exposed, and a groove in which the source electrode 4 is exposed on the bottom surface is formed. A part of the fourth insulation film 10 is removed according to the shape of the columnar portion of the drain field plate electrode 8 so that the surface of the drain electrode 5 is exposed, and a groove in which the drain electrode 5 is exposed on the bottom surface is formed.

The step of forming the source field plate electrode 7 and the drain field plate electrode 8 includes forming a metal film of the source field plate electrode 7 and the drain field plate electrode 8 on the portion opened in the step of opening the insulation film on the source electrode 4 and the drain electrode 5 and the fourth insulation film 10, and patterning the metal film according to each electrode shape. For example, the semiconductor device 100 can be manufactured by the method described above.

Second Embodiment

Figure 30:
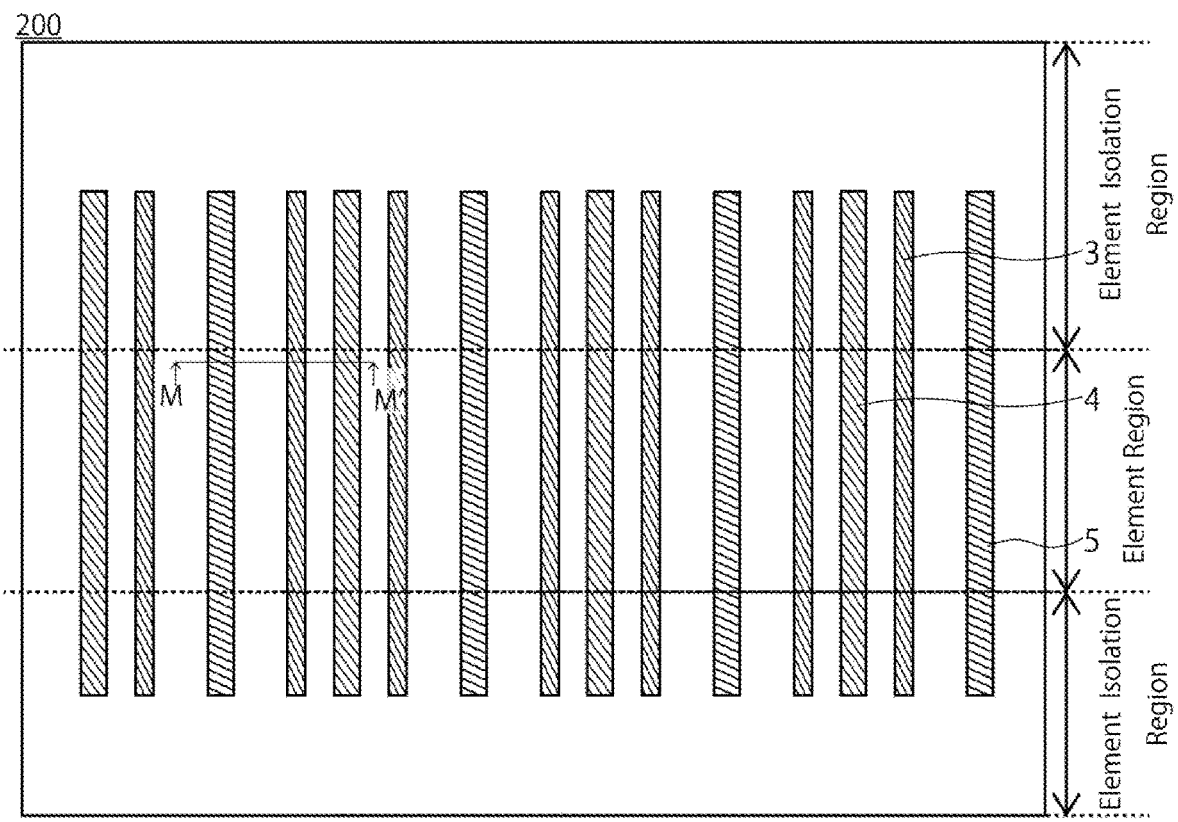
FIG. 30 is a schematic view of a semiconductor device according to an embodiment.
Figure 31:
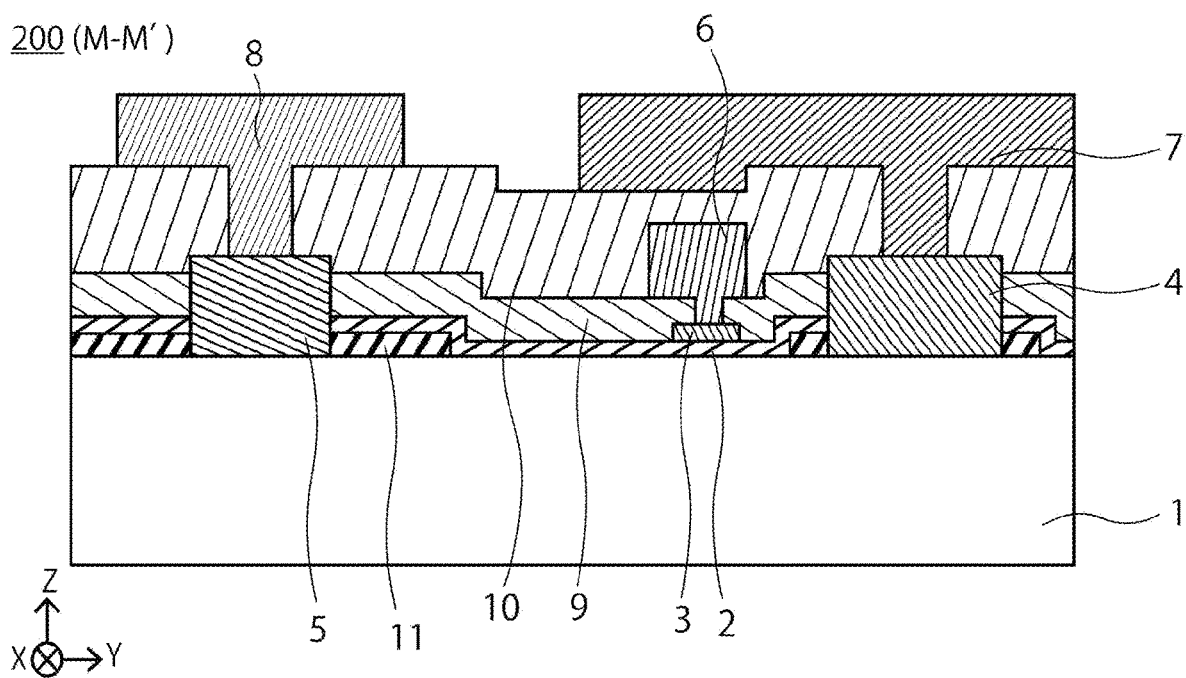
FIG. 31 is a schematic cross-sectional view of a semiconductor device according to an embodiment.
Figure 32:
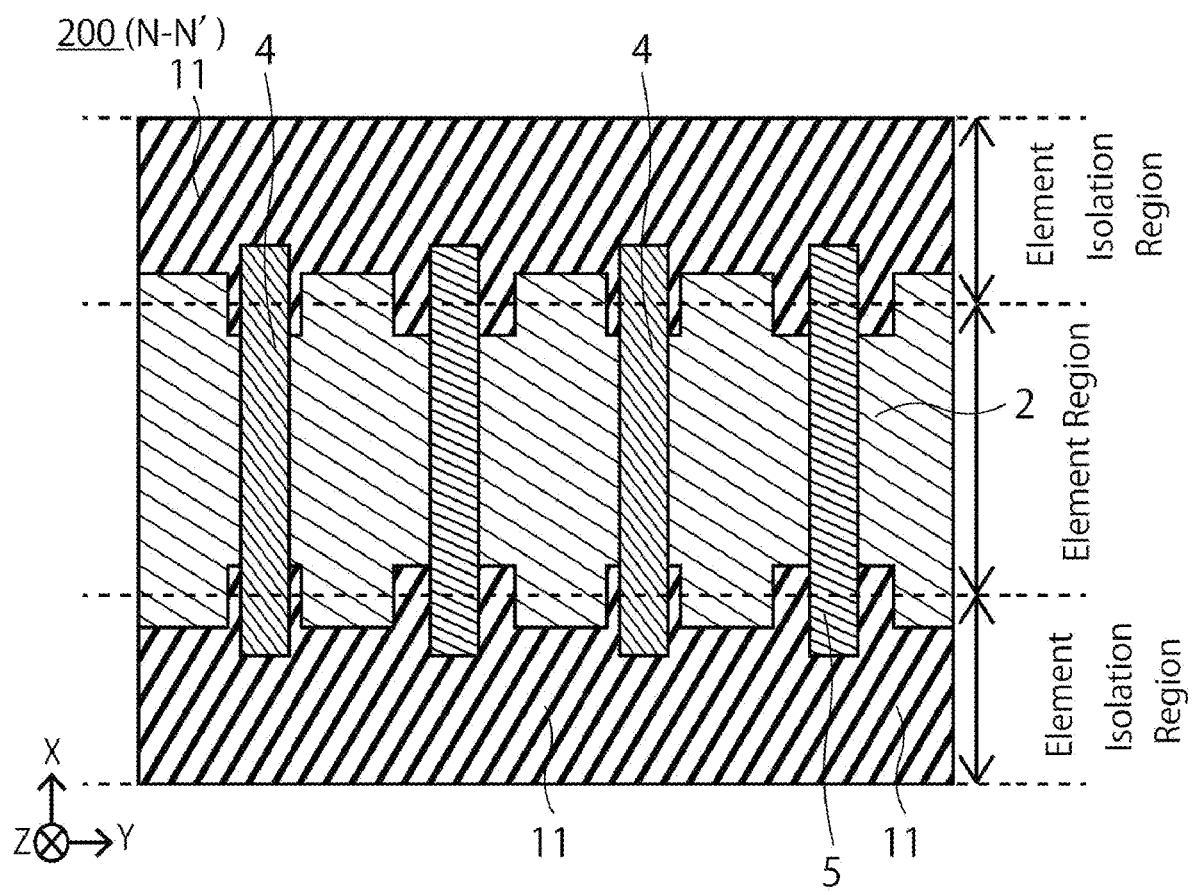
FIG. 32 is a schematic cross-sectional view of a semiconductor device according to an embodiment.

The semiconductor device of the second embodiment is a modification example of the semiconductor device 100 of the first embodiment. FIG. 30 is a schematic view of a semiconductor device 200 according to the second embodiment. FIG. 31 is a partial cross-sectional view of the semiconductor device 200 corresponding to a position taken along line M-M' in FIG. 30. FIG. 32 is a partial cross-sectional view of the semiconductor device 200 corresponding to a position taken along line N-N' in FIG. 31. The gate field plate electrode 6, the source field plate electrode 7, and the drain field plate electrode 8 (not illustrated in FIG. 30) are connected to a gate electrode pad 3A, a source electrode pad 4A, and a drain electrode pad 5A, respectively.

In the semiconductor device 200 of the second embodiment, the gate electrode 3, the source electrode 4, and the drain electrode 5 are not comb-shaped, but a plurality of finger electrodes are arranged.

In the semiconductor device 200 of the second embodiment, the buffer films 11 also interpose the source electrode 4, in a similar manner to the drain electrode 5. Since the source electrode 4 is interposed between the buffer films 11, withstand voltage between a source and a drain is further increased. Therefore, withstand voltage of the semiconductor device 200 is improved and reliability of the device is further improved.

The buffer films 11 interposing the source electrode 4 are preferably provided up to a position at a distance of 0.1 μm or greater and 3.0 μm or less from the boundary between the element region and the element isolation region 12 toward the element region (first direction) from the same position as that of the buffer films 11 under the gate electrode 3 in the first direction, and are more preferably provided up to a position at a distance of 0.1 μm or greater and 0.5 μm or less.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a semiconductor layer including an element region and an element isolation region;
    a first insulation film provided on the semiconductor layer;
    a first electrode provided on the first insulation film and extending in a first direction;
    a second electrode provided on the semiconductor layer, arranged in a second direction intersecting with the first direction, and extending in the first direction;
    a third electrode provided on the semiconductor layer, arranged in the second direction, and extending in the first direction;
    second insulation films provided between the first insulation film and the semiconductor layer, and interposing the third electrode in the second direction;
    a first field plate electrode provided on the first electrode and connected to the first electrode;
    a second field plate electrode provided on the first field plate electrode and connected to the second electrode; and
    a third field plate electrode provided on the third electrode and connected to the third electrode,
    wherein the second insulation films extend from the element isolation region to a part of the element region.

2. The device according to claim 1, wherein the second insulation films are not provided between the semiconductor layer on the element region and the first insulation film under the first electrode.

3. The device according to claim 1, wherein the second insulation films are provided between the semiconductor layer of the element isolation region and the first electrode.

4. The device according to claim 1, wherein the second insulation films have a side surface in contact with the third electrode, and
    a side surface of the second insulation films on a side opposite to the side surface in contact with the third electrode is positioned between the second field plate electrode and the third field plate electrode in the second direction.

5. The device according to claim 1, wherein the second insulation films have a side surface in contact with the third electrode, and
    a side surface of the second insulation films on a side opposite to the side surface in contact with the third electrode is positioned at a distance of 0.1 μm or greater and 20 μm or less from a surface on the second field plate electrode side of the third field plate electrode toward the second field plate electrode in the second direction.

6. The device according to claim 1, wherein a thickness of the second insulation films is 20 nm or greater and 500 nm or less.

7. The device according to claim 1, wherein a density (g/cm$^3$) of the first insulation film is higher than a density (g/cm$^3$) of the second insulation films.

8. The device according to claim 1, wherein the second insulation films are provided up to a position at a distance of 0.1 μm or greater and 3.0 μm or less from a boundary between the element region and the element isolation region toward the element region side in a portion in which the third electrode is interposed, and
  on the element isolation region, the second insulation films are not provided between the semiconductor layer and the first insulation film under the first electrode up to a position at a distance of 0.1 μm or greater and 3.0 μm or less from a boundary between the element region and the element isolation region toward the element isolation region side.

9. The device according to claim 1, wherein the semiconductor layer includes a first nitride semiconductor layer and a second nitride semiconductor layer.

10. The device according to claim 9, wherein the first insulation film, the second insulation films, the second electrode, and the third electrode are in direct contact with a surface of the second nitride semiconductor layer on a side opposite to the first nitride semiconductor layer side.

11. The device according to claim 1, wherein the second insulation films are in direct contact with the semiconductor layer and the first insulation film.

12. The device according to claim 1, wherein
  the first electrode includes a plurality of fingers extending in the first direction,
  the fingers of the first electrode extend in the first direction and are arranged in the second direction,
  the second electrode includes a plurality of fingers extending in the first direction,
  the fingers of the second electrode extend in the first direction and are arranged in the second direction,
  the third electrode includes a plurality of fingers extending in the first direction, and
  the fingers of the third electrode extend in the first direction and are arranged in the second direction.

13. The device according to claim 1, wherein an area of a surface on which the second insulation films are in contact with the semiconductor layer on the element region is 10% or less of an area of a surface of the semiconductor layer on the first insulation film side of the element region.

* * * * *